US012765029B2

(12) United States Patent
Chen et al.

(10) Patent No.: US 12,765,029 B2
(45) Date of Patent: Oct. 13, 2026

(54) FIELD EFFECT TRANSISTOR WITH NARROWED SPACER AND METHOD

(71) Applicant: Taiwan Semiconductor Manufacturing Co., Ltd., Hsinchu (TW)

(72) Inventors: Shih-Cheng Chen, Hsinchu (TW); Jung-Hung Chang, Hsinchu (TW); Chien Ning Yao, Hsinchu (TW); Tsung-Han Chuang, Hsinchu (TW); Kuo-Cheng Chiang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 559 days.

(21) Appl. No.: 18/456,241

(22) Filed: Aug. 25, 2023

(65) Prior Publication Data

US 2024/0355907 A1 Oct. 24, 2024

Related U.S. Application Data

(60) Provisional application No. 63/497,947, filed on Apr. 24, 2023.

(51) Int. Cl.

| | |
|---|---|
| ***H10D 64/01*** | (2025.01) |
| ***H10D 30/01*** | (2025.01) |
| ***H10D 30/43*** | (2025.01) |
| ***H10D 30/67*** | (2025.01) |
| ***H10D 62/10*** | (2025.01) |
| ***H10D 62/13*** | (2025.01) |
| ***H10D 84/01*** | (2026.01) |

(Continued)

(52) U.S. Cl.
CPC ......... *H10D 64/017* (2025.01); *H10D 30/014* (2025.01); *H10D 30/43* (2025.01); *H10D 30/6735* (2025.01); *H10D 30/6757* (2025.01); *H10D 62/121* (2025.01); *H10D 62/151* (2025.01); *H10D 64/018* (2025.01); *H10D 84/013* (2025.01); *H10D 84/0147* (2025.01); *H10D 84/038* (2025.01); *H10D 84/83* (2025.01)

(58) Field of Classification Search
CPC ..... H10D 64/017; H10D 30/014; H10D 30/43
See application file for complete search history.

(56) References Cited

U.S. PATENT DOCUMENTS

| | | | |
|---|---|---|---|
| 9,236,267 | B2 | 1/2016 | De et al. |
| 9,502,265 | B1 | 11/2016 | Jiang et al. |

(Continued)

FOREIGN PATENT DOCUMENTS

| | | | |
|---|---|---|---|
| KR | 20180070316 | A | 6/2018 |
| KR | 20210102807 | A | 8/2021 |

(Continued)

*Primary Examiner* — Marvin Payen
(74) *Attorney, Agent, or Firm* — Seed IP Law Group

(57) ABSTRACT

A device includes: a stack of semiconductor channels; a gate structure wrapping around the semiconductor channels; a source/drain region abutting the semiconductor channels; a source/drain contact on the source/drain region; and a gate spacer between the source/drain contact and the gate structure. The gate spacer includes: a first spacer layer in contact with the gate structure; and a second spacer layer between the first spacer layer and the source/drain contact, the second spacer layer having a first portion on the stack and a second portion on the first portion, the second portion being thinner than the first portion.

20 Claims, 29 Drawing Sheets

(51) Int. Cl.
*H10D 84/03* (2025.01)
*H10D 84/83* (2025.01)

(56) References Cited

U.S. PATENT DOCUMENTS

| | | | |
|---|---|---|---|
| 9,520,466 | B2 | 12/2016 | Holland et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,786,774 | B2 | 10/2017 | Colinge et al. |
| 9,853,101 | B2 | 12/2017 | Peng et al. |
| 9,881,993 | B2 | 1/2018 | Ching et al. |
| 2019/0363086 | A1 | 11/2019 | Yang et al. |
| 2022/0367620 | A1 | 11/2022 | Yang et al. |
| 2023/0052975 | A1 | 2/2023 | Wei et al. |

FOREIGN PATENT DOCUMENTS

| | | | |
|---|---|---|---|
| KR | 20210152376 | A | 12/2021 |
| KR | 20230052202 | A | 4/2023 |
| TW | 201347005 | A | 11/2013 |
| TW | 202109891 | A | 3/2021 |
| TW | 202207368 | A | 2/2022 |
| TW | 202217979 | A | 5/2022 |

FIELD EFFECT TRANSISTOR WITH NARROWED SPACER AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
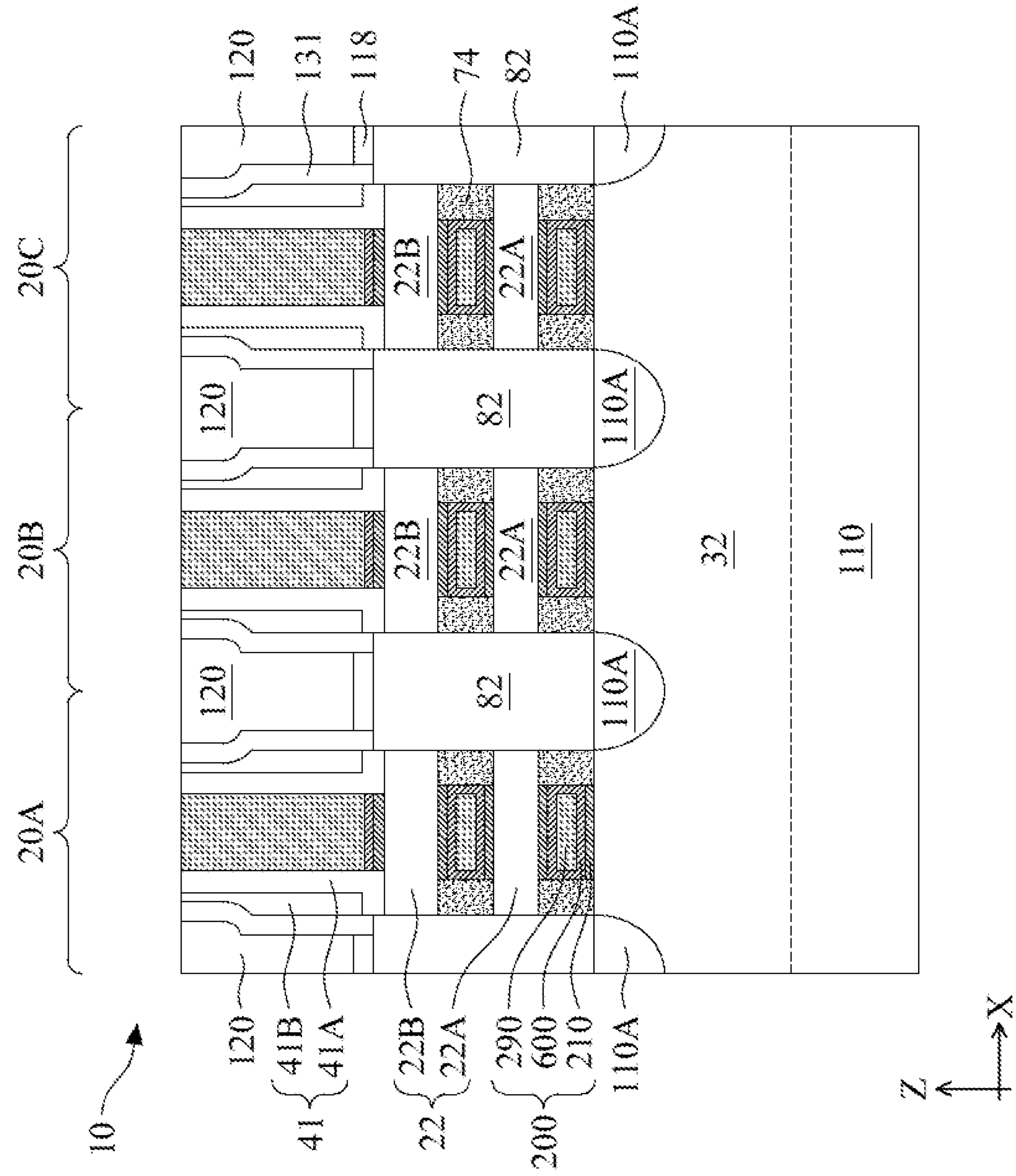
FIG. 1A is a diagrammatic cross-sectional side view of a portion of an IC device according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as "about," "substantially," and the like, should be interpreted as one having ordinary skill in the art would in view of current technological norms.

The terms "first," "second," "third" and so on may be used herein to describe a sequence of events or sequential order of elements but may be exchanged or varied in some contexts. For example, a second layer may be formed on (e.g., sequentially after) a first layer, but in some contexts the first layer may be referred to as a "second layer," "third layer," "fourth layer" or the like, and the second layer may be referred to as a "first layer," "third layer," "fourth layer," or the like.

The term "surrounds" may be used herein to describe a structure that fully or partially encloses another element or structure, for example, in three dimensions. For example, a first structure may "surround" a second structure on four lateral sides (e.g., left, right, front and back) without surrounding the second structure on two vertical sides (e.g., top and bottom). In other example, the first structure may wrap partially around the second structure, for example, by wrapping around three sides (e.g., top, front and back) while leaving other sides (e.g., left, right and bottom) exposed.

The present disclosure is generally related to semiconductor devices, and more particularly to field-effect transistors (FETs), such as planar FETs, three-dimensional fin FETs (FinFETs), or nanostructure FETs, such as nanosheet FETs (NSFETs), nanowire FETs (NWFETs), gate-all-around FETs (GAAFETs) and the like.

Poly-poly spacing and/or pitch scaling is increasingly problematic due to aspect ratio of poly-to-poly openings. A high aspect ratio may increase the risk of poly gate collapse. In addition, source/drain region epitaxial precursors may flow onto a semiconductor surface (e.g., Si nanosheet) with difficulty, leading to poor epitaxial growth and nodule risk (e.g., epitaxial formation on spacer surface).

Embodiments of the disclosure provide a process which forms a thinned gate spacer. An upper portion of the gate spacer is trimmed before or after inner spacer deposition to achieve a T-shaped poly-poly opening. Spacing difference may be increased by as much as 15% to over 25%, which is beneficial to reduce aspect ratio and poly collapse, while increasing epitaxial growth window and preventing formation of epitaxial nodules.

The nanostructure transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the nanostructure structure.

FIG. 1A illustrates a diagrammatic cross-sectional side view of a portion of a nanostructure device 10 in accordance with various embodiments. FIG. 1A illustrates a view in an X-Z plane, in which a second gate spacer layer 41B is partially or fully removed (e.g., thinned). The nanostructure device 10 of FIG. 1A is described in detail below to provide context for understanding the technical features and benefits of the various embodiments depicted in FIGS. 2A-27.

Referring to FIG. 1A, nanostructure devices 20A, 20B, 20C may be or include one or more N-type FETs (NFETs) or P-type FETs (PFETs). The nanostructure devices 20A-20C are formed over and/or in a substrate 110, and generally include gate structures 200 straddling and/or wrapping around semiconductor channels 22A, 22B, alternately referred to as "nanostructures," located over semiconductor fins 32 protruding from, and separated by, isolation structures 36 (see FIG. 3B). The gate structure 200 controls electrical current flow through the channels 22A, 22B.

The nanostructure devices 20A-20C are shown including two channels 22A, 22B, which are laterally abutted by source/drain features 82, and covered and surrounded by the gate structure 200. Generally, the number of channels 22 is two or more, such as three or four or more. The gate structure 200 controls flow of electrical current through the channels 22A, 22B to and from the source/drain features 82 based on voltages applied at the gate structure 200 and at the source/drain features 82.

In some embodiments, the fin structure 32 includes silicon. In some embodiments, the nanostructure devices 20A-20C include an NFET, and the source/drain features 82 thereof include silicon phosphorous (SiP), SiAs, SiSb, SiPAs, SiP:As:Sb, combinations thereof, or the like. In some embodiments, the nanostructure devices 20A-20C include a PFET, and the source/drain features 82 thereof include silicon germanium (SiGe), either undoped or doped to form, for example, SiGe:B, SiGe:B:Ga, SiGe:Sn, SiGe:B:Sn, or another appropriate semiconductor material. Generally, the source/drain features 82 may include any combination of appropriate semiconductor material(s) and appropriate dopant(s).

The channels 22A, 22B each include a semiconductive material, for example silicon or a silicon compound, such as silicon germanium, or the like. The channels 22A, 22B are nanostructures (e.g., having sizes that are in a range of a few nanometers) and may also each have an elongated shape and extend in the X-direction. In some embodiments, the channels 22A, 22B each have a nanowire (NW) shape, a nanosheet (NS) shape, a nanotube (NT) shape, or other suitable nanoscale shape. The cross-sectional profile of the channels 22A, 22B may be rectangular, round, square, circular, elliptical, hexagonal, or combinations thereof.

Figure 3B:
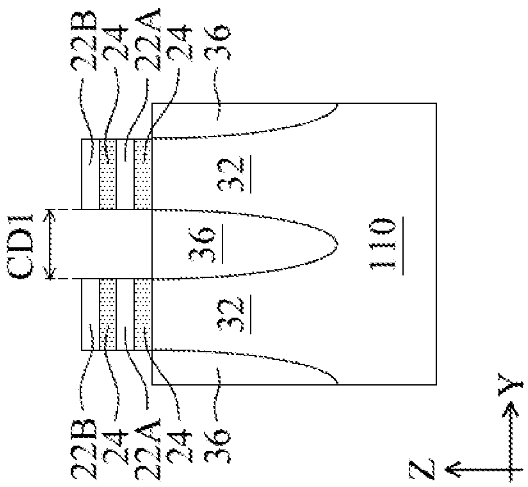
Figure 3A:
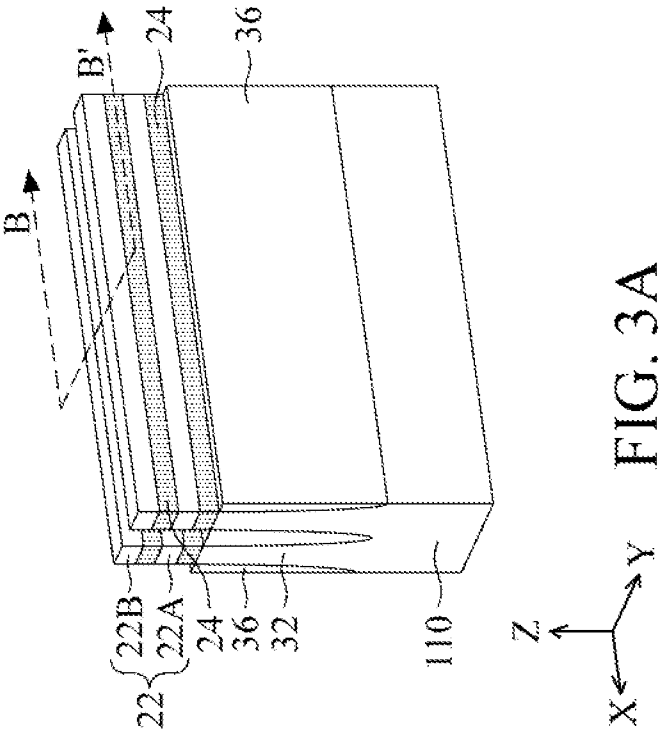

In some embodiments, the lengths (e.g., measured in the X-direction) of the channels 22A, 22B may be different from each other, for example due to tapering during a fin etching process (see FIGS. 3A, 3B). In some embodiments, length of the channel 22A may be less than a length of the channel 22B. The channels 22A, 22B each may not have uniform thickness (e.g., along the X-axis direction), for example due to a channel trimming process used to expand spacing (e.g., measured in the Z-axis direction) between the channels 22A, 22B to increase gate structure fabrication process window. For example, a middle portion of each of the channels 22A, 22B may be thinner than the two ends of each of the channels 22A, 22B. Such shape may be collectively referred to as a "dog-bone" shape.

In some embodiments, the spacing between the channels 22A, 22B (e.g., between the channel 22B and the channel 22A) is in a range between about 8 nanometers (nm) and about 12 nm. In some embodiments, a thickness (e.g., measured in the Z-direction) of each of the channels 22A, 22B is in a range between about 5 nm and about 8 nm. In some embodiments, a width (e.g., measured in the Y-direction, shown in FIG. 2A, orthogonal to the X-Z plane shown in FIG. 1B) of each of the channels 22A, 22B is at least about 8 nm.

The gate structure 200 is disposed over and between the channels 22A, 22B, respectively. In some embodiments, the gate structure 200 is disposed over and between the channels 22A, 22B, which are silicon channels for N-type devices or silicon germanium channels for P-type devices. In some embodiments, the gate structure 200 includes an interfacial layer (IL) 210, one or more gate dielectric layers 600, one or more work function tuning layers 900 (see FIG. 24), and a metal core layer 290.

The interfacial layer 210, which may be an oxide of the material of the channels 22A, 22B, is formed on exposed areas of the channels 22A, 22B and the top surface of the fin 32. The interfacial layer 210 promotes adhesion of the gate dielectric layers 600 to the channels 22A, 22B. In some embodiments, the interfacial layer 210 has thickness of about 5 Angstroms (A) to about 50 Angstroms (A). In some embodiments, the interfacial layer 210 has thickness of about 10 A. The interfacial layer 210 having thickness that is too thin may exhibit voids or insufficient adhesion properties. The interfacial layer 210 being too thick consumes gate fill window, which is related to threshold voltage tuning and resistance. In some embodiments, the interfacial layer 210 is doped with a dipole, such as lanthanum, for threshold voltage tuning.

In some embodiments, the gate dielectric layer 600 includes at least one high-k gate dielectric material, which may refer to dielectric materials having a high dielectric constant that is greater than a dielectric constant of silicon oxide ($k \approx 3.9$). Example high-k dielectric materials include $HfO_2$, HfSiO, HfSiON, HfTaO, HfTiO, HfZrO, $ZrO_2$, $Ta_2O_5$, or combinations thereof. In some embodiments, the gate dielectric layer 600 has thickness of about 5 A to about 100 A. The gate dielectric layer 600 may be a single layer or a multilayer.

The gate structure 200 also includes metal core layer 290. The metal core layer 290 may include a conductive material such as Co, W, Ru, combinations thereof, or the like. In some embodiments, the metal core layer 290 is or includes a Co-, W- or Ru-based compound or alloy including one or more elements, such as Zr, Sn, Ag, Cu, Au, Al, Ca, Be, Mg, Rh, Na, Ir, W, Mo, Zn, Ni, K, Co, Cd, Ru, In, Os, Si, Ge, Mn, combinations thereof, or the like. Between the channels 22A, 22B, the metal core layer 290 is circumferentially surrounded (in the cross-sectional view) by the one or more work function metal layers 900, which are then circumferentially surrounded by the gate dielectric layers 600, which are circumferentially surrounded by the interfacial layer 210. The gate structure 200 may also include a glue layer that is formed between the one or more work function layers 900 and the metal core layer 290 to increase adhesion. The glue layer is not specifically illustrated in FIG. 1A for simplicity.

The nanostructure devices 20A, 20B, 20C may further include source/drain contacts 120 that are formed over the source/drain features 82. The source/drain contacts 120 may include a core layer that is or includes a conductive material such as tungsten, ruthenium, cobalt, copper, titanium, titanium nitride, tantalum, tantalum nitride, iridium, molybdenum, nickel, aluminum, or combinations thereof. The core layer may be surrounded by one or more liner (or, "barrier") layers, such as SiN or TiN, which help prevent or reduce diffusion of materials from and into the source/drain contacts 120. In some embodiments, height of the source/drain contacts 120 may be in a range of about 1 nm to about 50 nm.

Silicide layers 118 are formed between the source/drain features 82 and the source/drain contacts 120, at least to reduce the source/drain contact resistance. In some embodiments, the silicide layer 118 is or includes TiSi, CrSi, TaSi, MoSi, ZrSi, HfSi, ScSi, Ysi, HoSi, TbSI, GdSi, LuSi, DySi, ErSi, YbSi, or the like. In some embodiments, the silicide layer 118 is or includes NiSi, CoSi, MnSi, Wsi, FeSi, RhSi, PdSi, RuSi, PtSi, IrSi, OsSi, or the like. The silicide layer 118 may have thickness in a range of about 1 nm to about 10 nm. Thickness lower than about 1 nm may lead to an insufficient reduction in contact resistance. Thickness above about 10 nm may cause electrical shorting with the nanostructures 22. In some embodiments, the silicide layer 118 is present below, and in contact with, etch stop layer 131.

The nanostructure devices 20A, 20B, 20C may further include an interlayer dielectric (ILD, not depicted). The ILD provides electrical isolation between the various components of the nanostructure devices 20A, 20B, 20C discussed above, for example between neighboring pairs of the source/drain contacts 120. An etch stop layer 131 may be formed prior to forming the ILD and may be positioned laterally between the ILD and the gate spacers 41 and vertically between the ILD and the source/drain features 82. In some embodiments, the etch stop layer 131 is or includes SiN, SiCN, SiC, SiOC, SiOCN, $HfO_2$, $ZrO_2$, $ZrAlO_x$, $HfAlO_x$, $HfSiO_x$, $Al_2O_3$, or other suitable material. In some embodiments, thickness of the etch stop layer is in a range of about 1 nm to about 5 nm. In some embodiments, where the ILD is not present (e.g., is removed completely prior to formation of the source/drain contacts 120), the etch stop layer 131 may be in contact with the source/drain contact 120. The etch stop layer 131 may be trimmed, for example, in the X-axis direction prior to formation of the source/drain contact 120 to improve fill quality of the source/drain contact 120.

The nanostructure devices 20A-20C include gate spacers 41 that are disposed on sidewalls of the metal core layer 290, the gate dielectric layer 600 and the IL 210 above the channel 22A, and inner spacers 74 that are disposed on sidewalls of the IL 210 and/or the gate dielectric layer 600 between the channels 22A, 22B. The inner spacers 74 are also disposed between the channels 22A, 22B. In the embodiment depicted in FIG. 1A, the gate spacers 41 include a first spacer layer 41A and a second spacer layer 41B on the first spacer layer 41A. The first and second spacer layers 41A, 41B may each include a dielectric material, for example a low-k material such as SiOCN, SiON, SiN, SiCN, SiOC or the like. In some embodiments, the second spacer layer 41B is not present. Material of the first and second spacer layers 41A, 41B may be the same as or different from each other. Generally, an upper portion of the second spacer layer 41B (or the first spacer layer 41A when the second spacer layer 41B is not present) is removed partially or fully to increase aspect ratio of an opening through which the source/drain region 82 is formed. FIG. 1A depicts an embodiment in which the upper portion of the second spacer layer 41B is thinned. More detailed description of thinning of the first and second spacer layers 41A, 41B and resultant structures is provided with reference to FIGS. 11, 22 and 23 below.

Figure 1B:
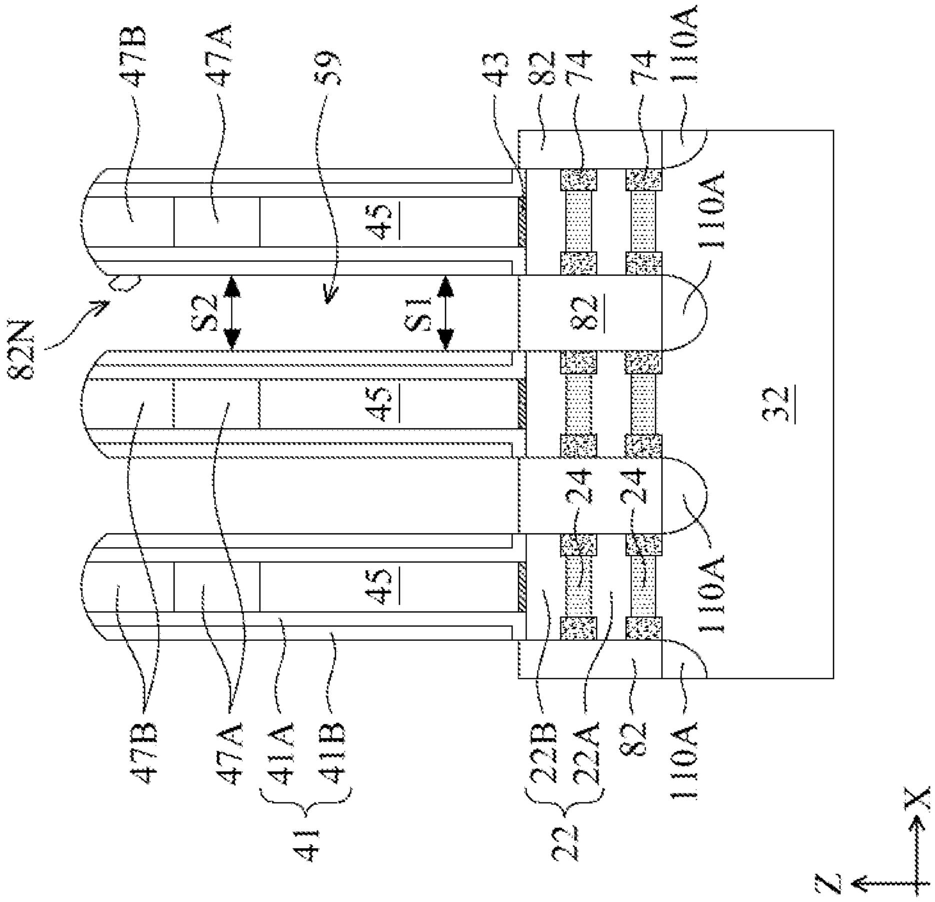
FIG. 1B is a view of an IC device at a source/drain region epitaxial growth stage.

FIG. 1B depicts formation of an epitaxial nodule 82N on the second spacer layer 41B when the second spacer layer 41B is not thinned. The gate spacer 41 is formed on sacrificial gate structure 45. As shown, a lower portion of an opening 59 in which the source/drain region 82 is formed has dimension S1 that is the same as a dimension S2 of an upper portion of the opening 59. Due to narrow spacing at the upper potion of the opening 59, growth of the epitaxial nodule 82N may occur on the second spacer layer 41B (or on the first spacer layer 41A when the second spacer layer 41B is not present). Embodiments of the present disclosure thin or remove the gate spacer 41 at the upper portion of the opening 59, which increases aspect ratio of the opening 59, improving epitaxial growth of the source/drain region 82 while preventing growth of the epitaxial nodule 82N.

Figure 24:
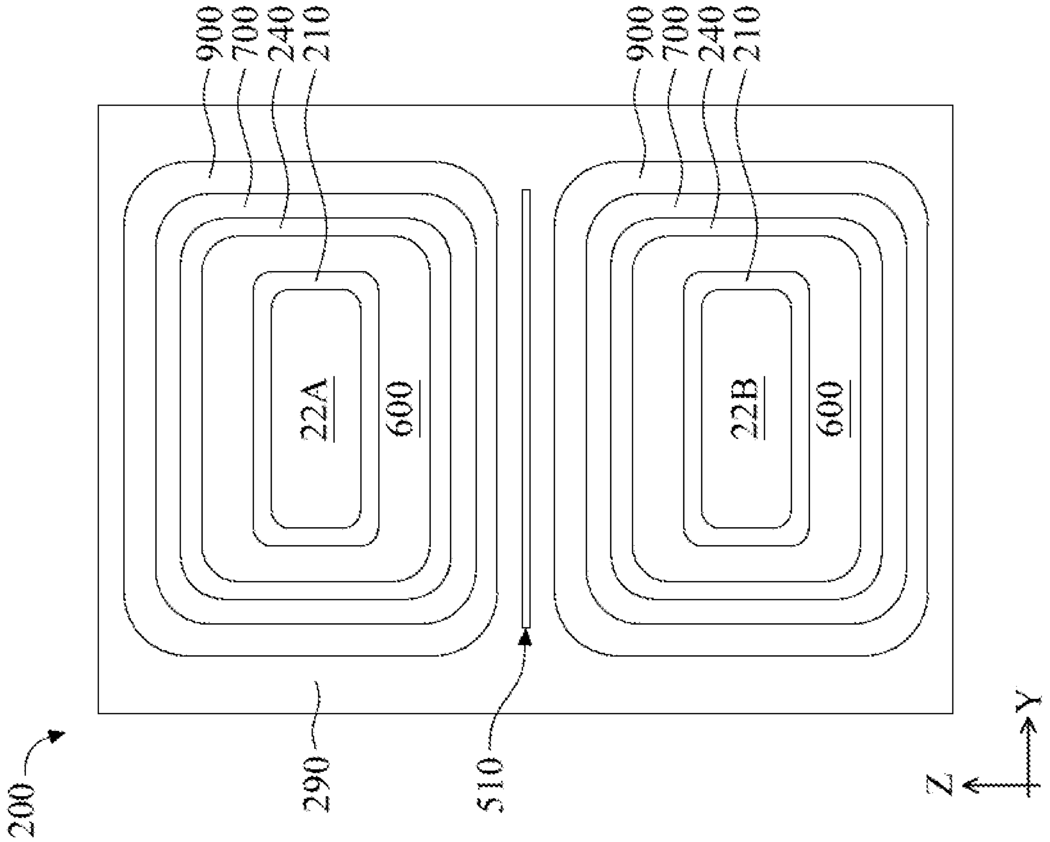
FIG. 24 is a diagrammatic cross-sectional side view of a gate structure of the IC devices in accordance with various embodiments.
Figure 25:
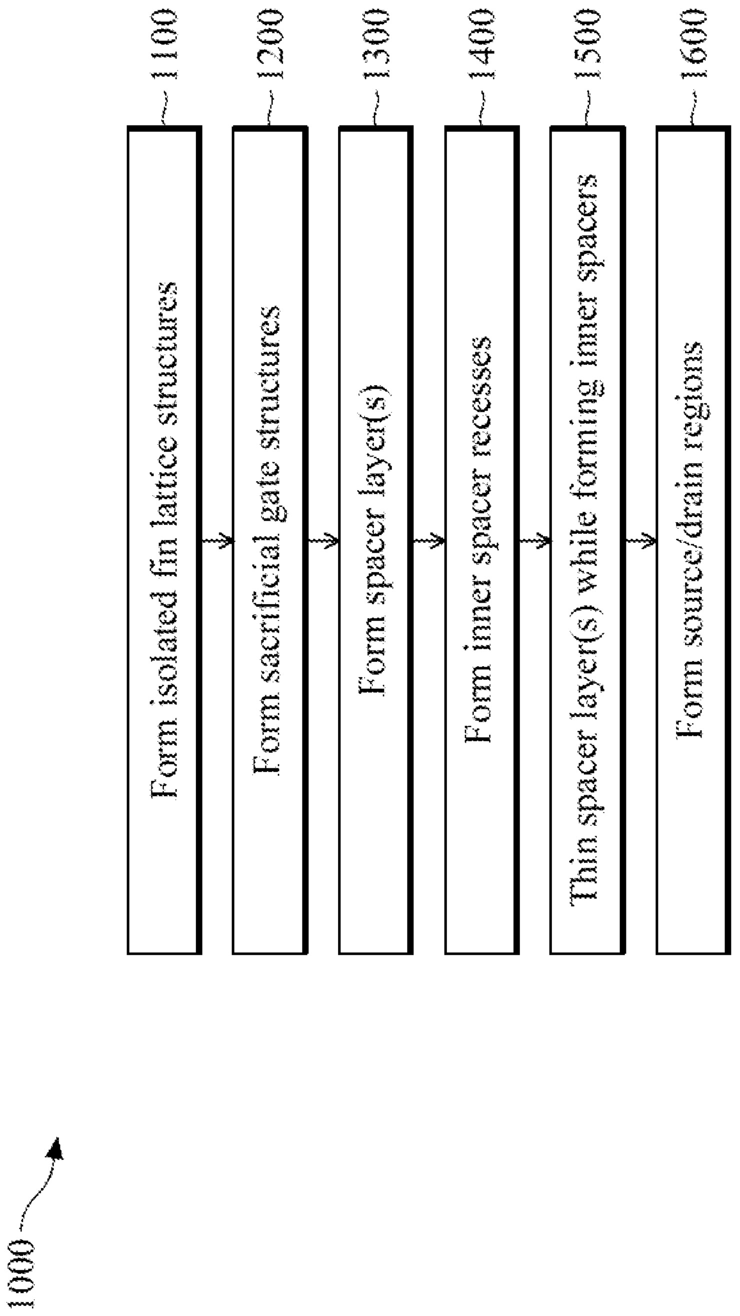
FIGS. 25-27 are flowcharts of methods of forming an IC device in accordance with various embodiments.
Figure 26:
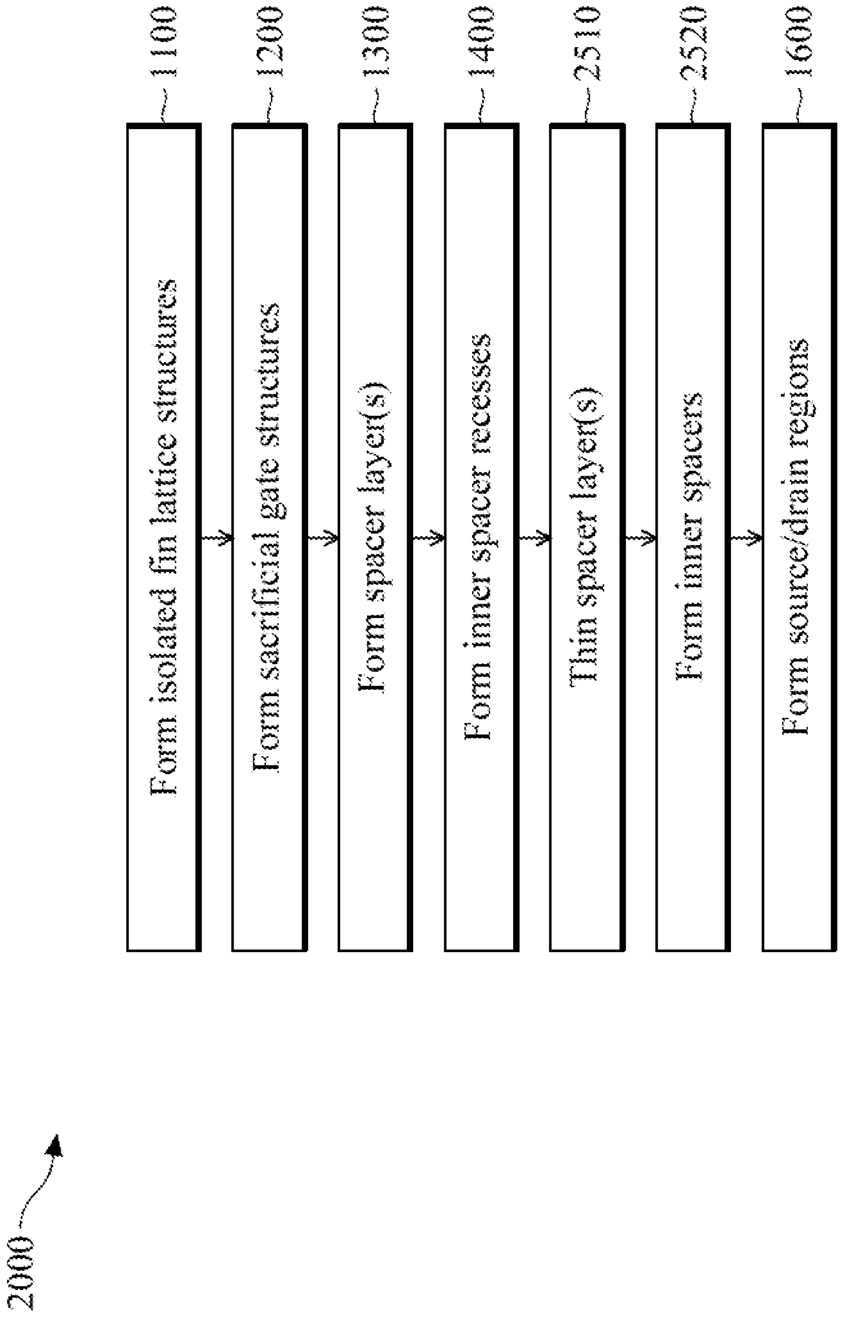
Figure 27:
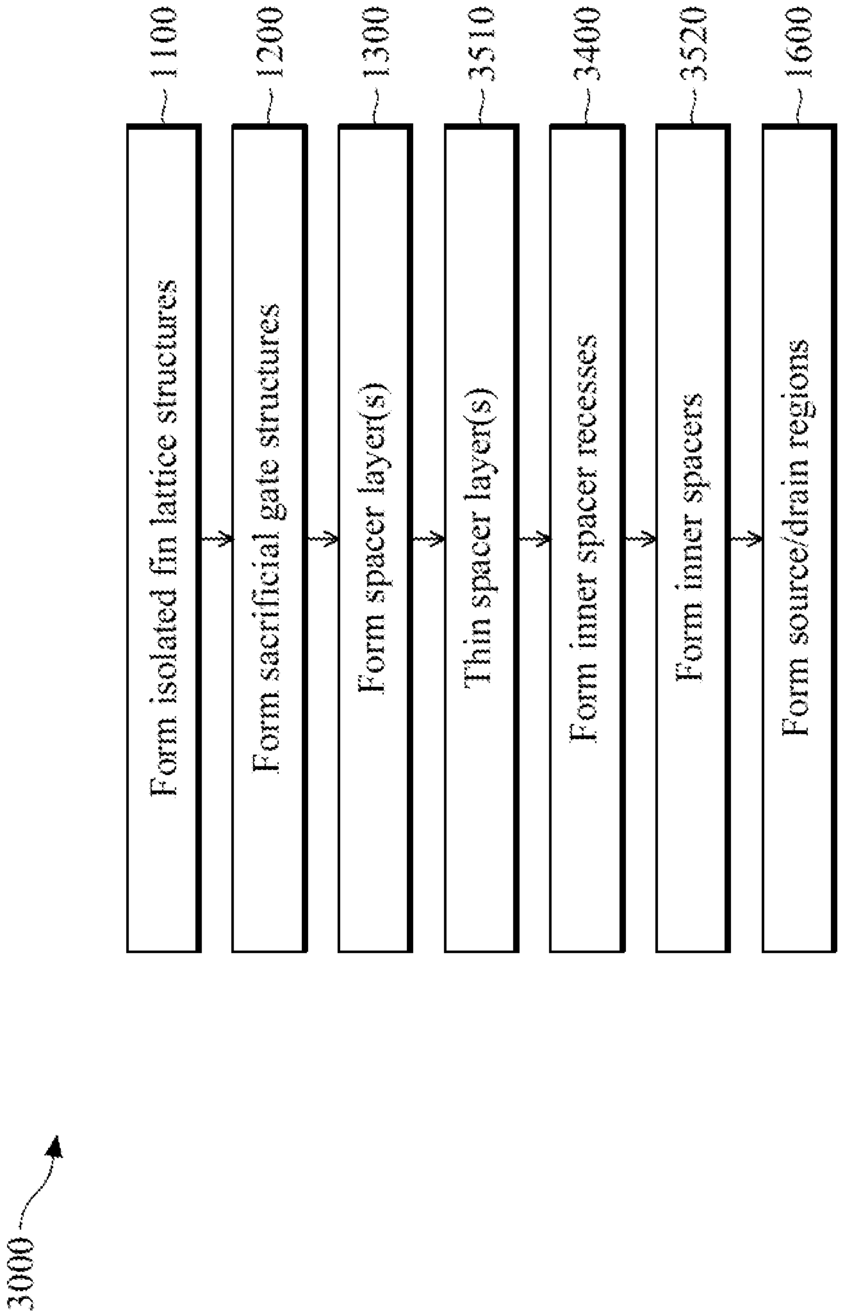

FIGS. 25, 26, 27 illustrate flowcharts of methods 1000, 2000, 3000 for forming an IC device or a portion thereof from a workpiece, according to one or more aspects of the present disclosure. Methods 1000, 2000, 3000 are merely examples and are not intended to limit the present disclosure to what is explicitly illustrated in methods 1000, 2000, 3000. Additional acts can be provided before, during and after the methods 1000, 2000, 3000 and some acts described can be replaced, eliminated, or moved around for additional embodiments of the method. Not all acts are described herein in detail for reasons of simplicity. Methods 1000, 2000, 3000 are described below in conjunction with fragmentary perspective and/or cross-sectional views of a workpiece, shown in FIGS. 2A-24, at different stages of fabrication according to embodiments of methods 1000, 2000, 3000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

FIGS. 2A through 24 are views of intermediate stages in the manufacturing of FETs, such as nanostructure FETs, in accordance with some embodiments.

Figure 2B:
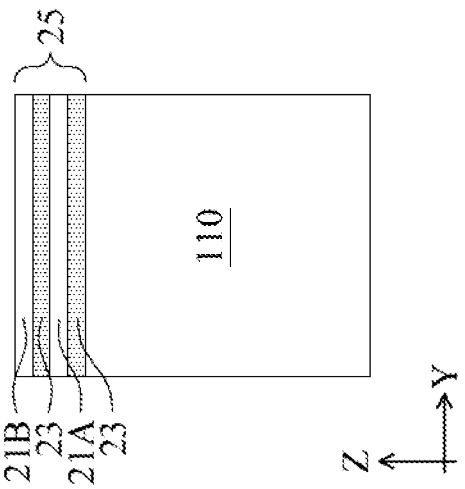
FIGS. 2A-12 are views of various embodiments of an IC device at various stages of fabrication according to various aspects of the present disclosure.
Figure 2A:
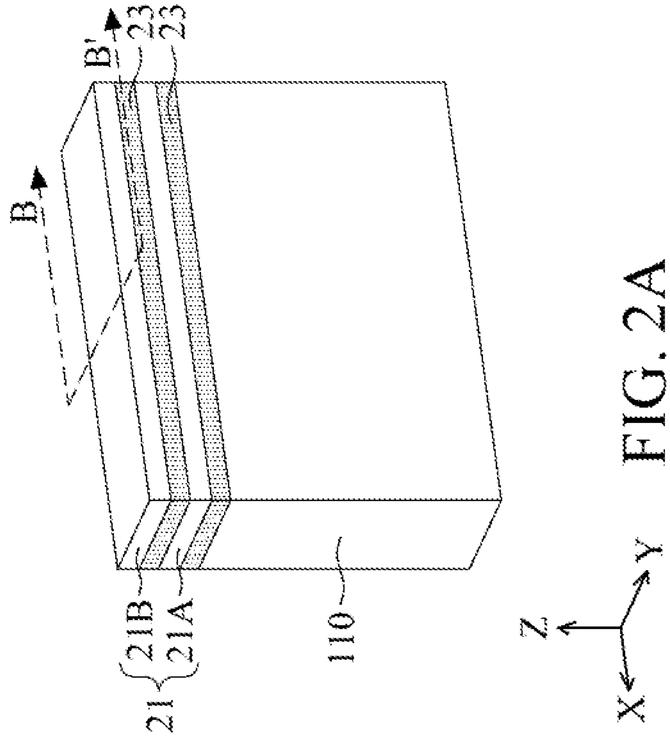

In FIG. 2A and FIG. 2B, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Further in FIG. 2A and FIG. 2B, a multi-layer stack 25 or "lattice" is formed over the substrate 110 of alternating layers of first semiconductor layers 21A, 21B (collectively referred to as first semiconductor layers 21) and second semiconductor layers 23. In some embodiments, the first semiconductor layers 21 may be formed of a first semiconductor material suitable for n-type nano-FETs, such as silicon, silicon carbide, or the like, and the second semiconductor layers 23 may be formed of a second semiconductor material suitable for p-type nano-FETs, such as silicon germanium or the like. Each of the layers 21, 23 of the multi-layer stack 25 may be epitaxially grown using a process such as chemical vapor deposition (CVD), atomic layer deposition (ALD), vapor phase epitaxy (VPE), molecular beam epitaxy (MBE), or the like.

Two layers of each of the first semiconductor layers 21 and the second semiconductor layers 23 are illustrated. In some embodiments, the multi-layer stack 25 may include one each or three or more each of the first semiconductor layers 21 and the second semiconductor layers 23. Although the multi-layer stack 25 is illustrated as including a second semiconductor layer 23 as the bottommost layer, in some embodiments, the bottommost layer of the multi-layer stack 25 may be a first semiconductor layer 21.

Due to high etch selectivity between the first semiconductor materials and the second semiconductor materials, the second semiconductor layers 23 of the second semiconductor material may be removed without significantly removing the first semiconductor layers 21 of the first semiconductor material, thereby allowing the first semiconductor layers 21 to be patterned to form channel regions of nano-FETs. In some embodiments, the first semiconductor layers 21 are removed and the second semiconductor layers 23 are patterned to form channel regions. The high etch selectivity allows the first semiconductor layers 21 of the first semiconductor material to be removed without significantly removing the second semiconductor layers 23 of the second semiconductor material, thereby allowing the second semiconductor layers 23 to be patterned to form channel regions of nano-FETs.

In FIG. 3A and FIG. 3B, fins 32 are formed in the substrate 110 and nanostructures 22, 24 are formed in the multi-layer stack 25 corresponding to act 1100 of FIGS. 25, 26, 27. In some embodiments, the nanostructures 22, 24 and the fins 32 may be formed by etching trenches in the multi-layer stack 25 and the substrate 110. The etching may be any acceptable etch process, such as a reactive ion etch (RIE), neutral beam etch (NBE), the like, or a combination thereof. The etching may be anisotropic. First nanostructures 22A, 22B (also referred to as "channels 22" below) are formed from the first semiconductor layers 21, and second nanostructures 24 are formed from the second semiconductor layers 23. Distance CDI between adjacent fins 32 and nanostructures 22, 24 may be from about 18 nm to about 100 nm. A portion of the device 10 is illustrated in FIGS. 3A and 3B including two fins 32 for simplicity of illustration. The processes 1000, 2000, 3000 illustrated in FIGS. 2A-24 may be extended to any number of fins, and are not limited to the two fins 32 shown in FIGS. 3A-24.

The fins 32 and the nanostructures 22, 24 may be patterned by any suitable method. For example, one or more photolithography processes, including double-patterning or multi-patterning processes, may be used to form the fins 32 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 32.

FIGS. 3A and 3B illustrate the fins 32 having tapered sidewalls, such that a width of each of the fins 32 and/or the nanostructures 22, 24 continuously increases in a direction towards the substrate 110. In such embodiments, each of the nanostructures 22, 24 may have a different width and be trapezoidal in shape. In other embodiments, the sidewalls are substantially vertical (non-tapered), such that width of the fins 32 and the nanostructures 22, 24 is substantially similar, and each of the nanostructures 22, 24 is rectangular in shape.

In FIGS. 3A and 3B, isolation regions 36, which may be shallow trench isolation (STI) regions, are formed adjacent the fins 32. The isolation regions 36 may be formed by depositing an insulation material over the substrate 110, the fins 32, and nanostructures 22, 24, and between adjacent fins 32 and nanostructures 22, 24. The insulation material may be an oxide, such as silicon oxide, a nitride, the like, or a combination thereof, and may be formed by high-density plasma CVD (HDP-CVD), flowable CVD (FCVD), the like, or a combination thereof. In some embodiments, a liner (not separately illustrated) may first be formed along surfaces of the substrate 110, the fins 32, and the nanostructures 22, 24. Thereafter, a core material, such as those discussed above may be formed over the liner.

The insulation material undergoes a removal process, such as a chemical mechanical polish (CMP), an etch-back process, combinations thereof, or the like, to remove excess insulation material over the nanostructures 22, 24. Top surfaces of the nanostructures 22, 24 may be exposed and level with the insulation material after the removal process is complete.

The insulation material is then recessed to form the isolation regions 36. After recessing, the nanostructures 22, 24 and upper portions of the fins 32 may protrude from between neighboring isolation regions 36. The isolation regions 36 may have top surfaces that are flat as illustrated, convex, concave, or a combination thereof. In some embodiments, the isolation regions 36 are recessed by an acceptable etching process, such as an oxide removal using, for example, dilute hydrofluoric acid (dHF), which is selective to the insulation material and leaves the fins 32 and the nanostructures 22, 24 substantially unaltered.

FIGS. 2A through 3B illustrate one embodiment (e.g., etch last) of forming the fins 32 and the nanostructures 22, 24. In some embodiments, the fins 32 and/or the nanostructures 22, 24 are epitaxially grown in trenches in a dielectric layer (e.g., etch first). The epitaxial structures may comprise the alternating semiconductor materials discussed above, such as the first semiconductor materials and the second semiconductor materials.

Further in FIG. 3A and FIG. 3B, appropriate wells (not separately illustrated) may be formed in the fins 32, the nanostructures 22, 24, and/or the isolation regions 36. Using masks, an n-type impurity implant may be performed in p-type regions of the substrate 110, and a p-type impurity implant may be performed in n-type regions of the substrate 110. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 32 and the nanostructures 22, 24 may obviate separate implantations, although in situ and implantation doping may be used together.

Figure 4C:
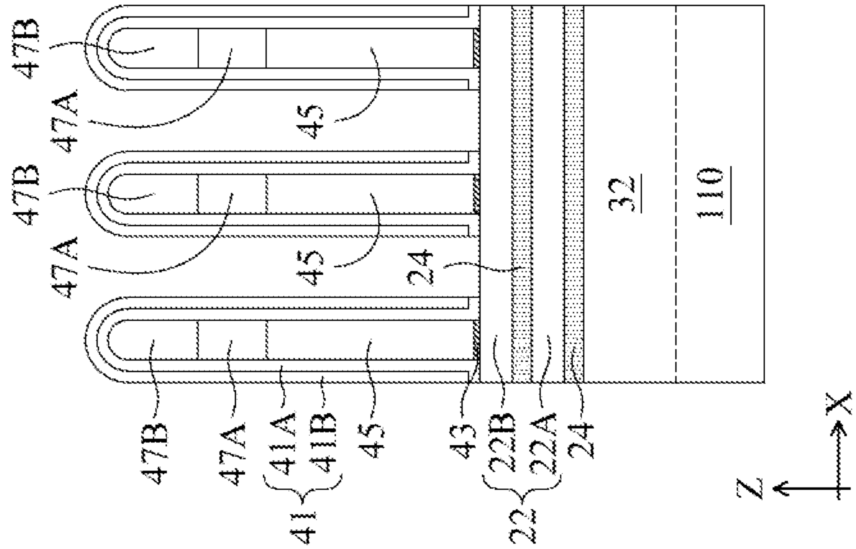
Figure 4B:
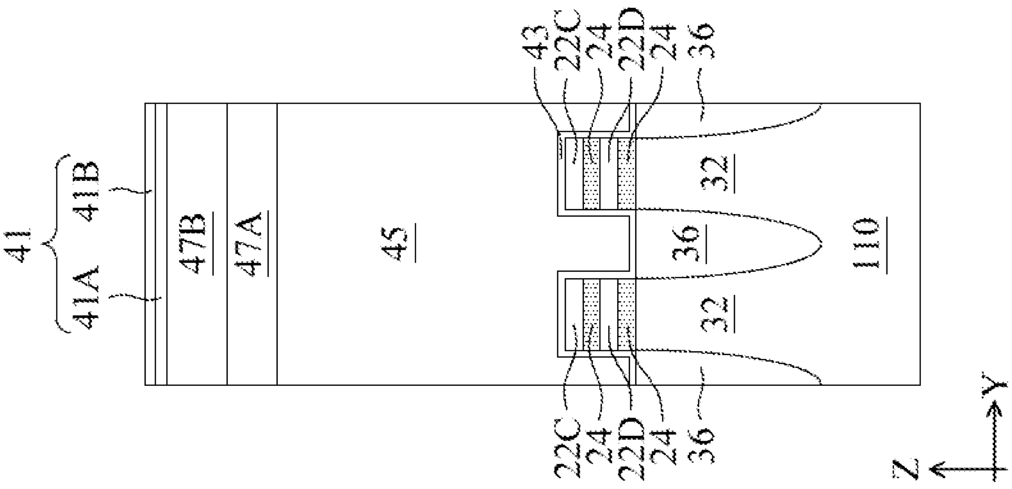
Figure 4A:
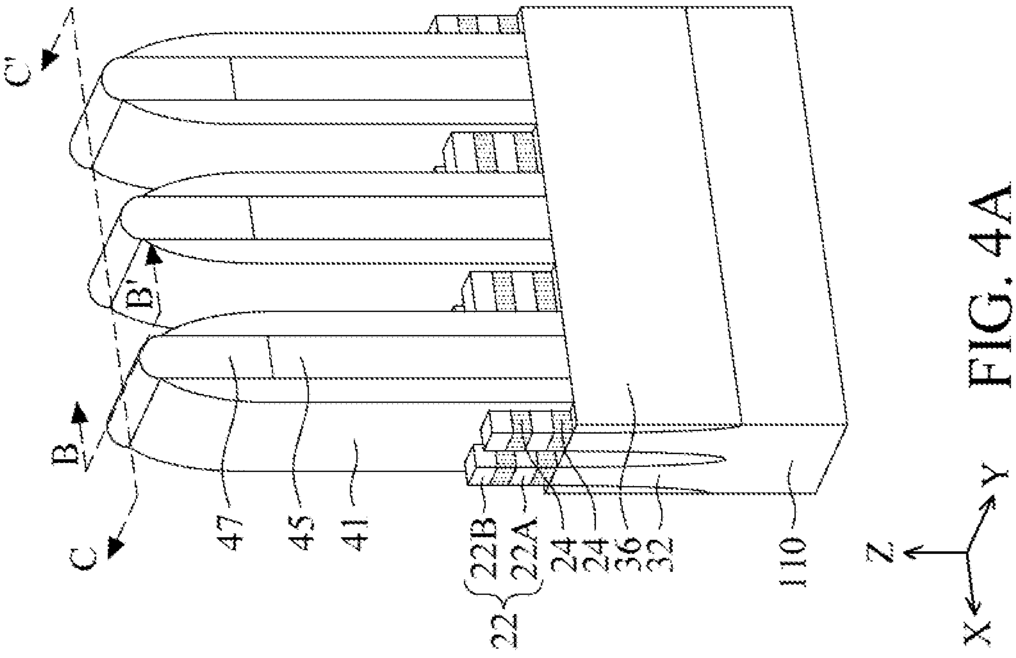

In FIGS. 4A-4C, dummy or sacrificial gate structures 40 are formed over the fins 32 and/or the nanostructures 22, 24, corresponding to act 1200 of FIGS. 25, 26, 27. A dummy or sacrificial gate layer 45 is formed over the fins 32 and/or the nanostructures 22, 24. The dummy gate layer 45 may be made of materials that have a high etching selectivity relative to the isolation regions 36. The dummy gate layer 45 may be a conductive, semiconductive, or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 45 may be deposited by physical vapor deposition (PVD), CVD, sputter deposition, or other techniques for depositing the selected material. A mask layer 47 is formed over the dummy gate layer 45, and may include, for example, silicon nitride, silicon oxynitride, or the like. In some embodiments, a gate dielectric layer 43 is formed before the dummy gate layer 45 between the dummy gate layer 45 and the fins 32 and/or the nanostructures 22, 24. In some embodiments, the mask layer 47 includes a first mask layer 47A in contact with the dummy gate layer 45, and a second mask layer 47B overlying the first mask layer 47A. The first mask layer 47A may be or include the same or different material as that of the second mask layer 47B.

A spacer layer 41 is formed over sidewalls of the mask layer 47 and the dummy gate layer 45, corresponding to act 1300 of FIGS. 25, 26, 27. The spacer layer 41 is made of an insulating material, such as SiOCN, SiOC, SiCN or the like (or any of the materials described with reference to FIG. 1A), and may have a single-layer structure or a multi-layer structure including a plurality of dielectric layers, in accordance with some embodiments. The spacer layer 41 may be formed by depositing a spacer material layer (not shown) over the mask layer 47 and the dummy gate layer 45. Portions of the spacer material layer between dummy gate structures 40 are removed using an anisotropic etching process, in accordance with some embodiments. In some embodiments, as shown in detail in FIGS. 4B, 4C, the spacer layer 41 includes a first spacer layer 41A in contact with the nanostructure 22A, the gate dielectric layer 43, the dummy gate layer 45 and the first and second mask layers 47A, 47B. A second spacer layer 41B of the spacer layer 41 may be in contact with the first spacer layer 41A and the nanostructure 22B. In some embodiments, the second spacer layer 41B is separated from the nanostructure 22B by the first spacer layer 41A, as depicted in FIG. 4C. The first spacer layer 41A may be or include the same or different material as that of the second spacer layer 41B.

Figure 5:
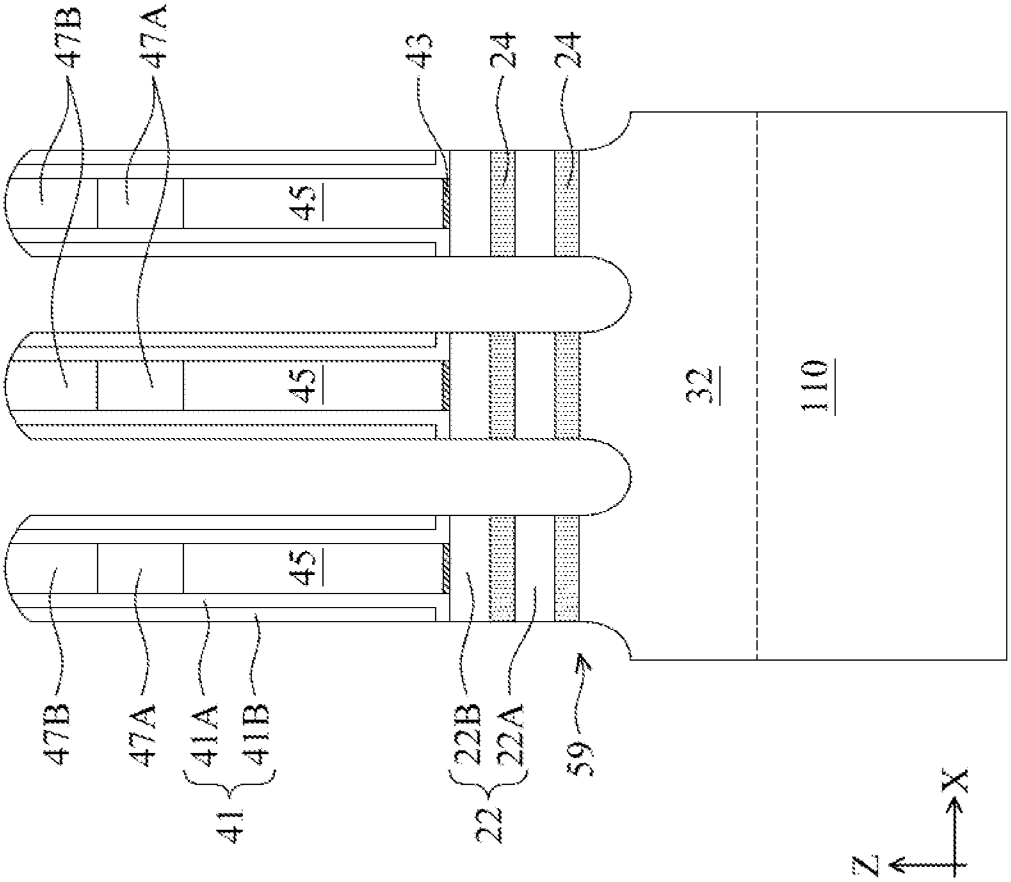

In FIG. 5, an etching process is performed to etch the portions of protruding fins 32 and/or nanostructures 22, 24 that are not covered by dummy gate structures 40, resulting in the structure shown. The recessing may be anisotropic, such that the portions of fins 32 directly underlying dummy gate structures 40 and the spacer layer 41 are protected and are not etched. The top surfaces of the recessed fins 32 may be substantially coplanar with the top surfaces of the isolation regions 36, in accordance with some embodiments. The top surfaces of the recessed fins 32 may be lower than the top surfaces of the isolation regions 36, in accordance with some other embodiments. FIG. 5 shows three vertical stacks of nanostructures 22, 24 following the etching process for simplicity. In general, the etching process may be used to form any number of vertical stacks of nanostructures 22, 24 over the fins 32. In some embodiments, the second mask layer 47B is exposed following the etching process, for example, due to removal of upper portions of the spacer layers 41A, 41B during the etching process.

FIGS. 6-11 illustrate thinning of the gate spacer 41 while forming inner spacers 74, corresponding to act 1400 and 1500 of FIG. 25.

Figure 6:
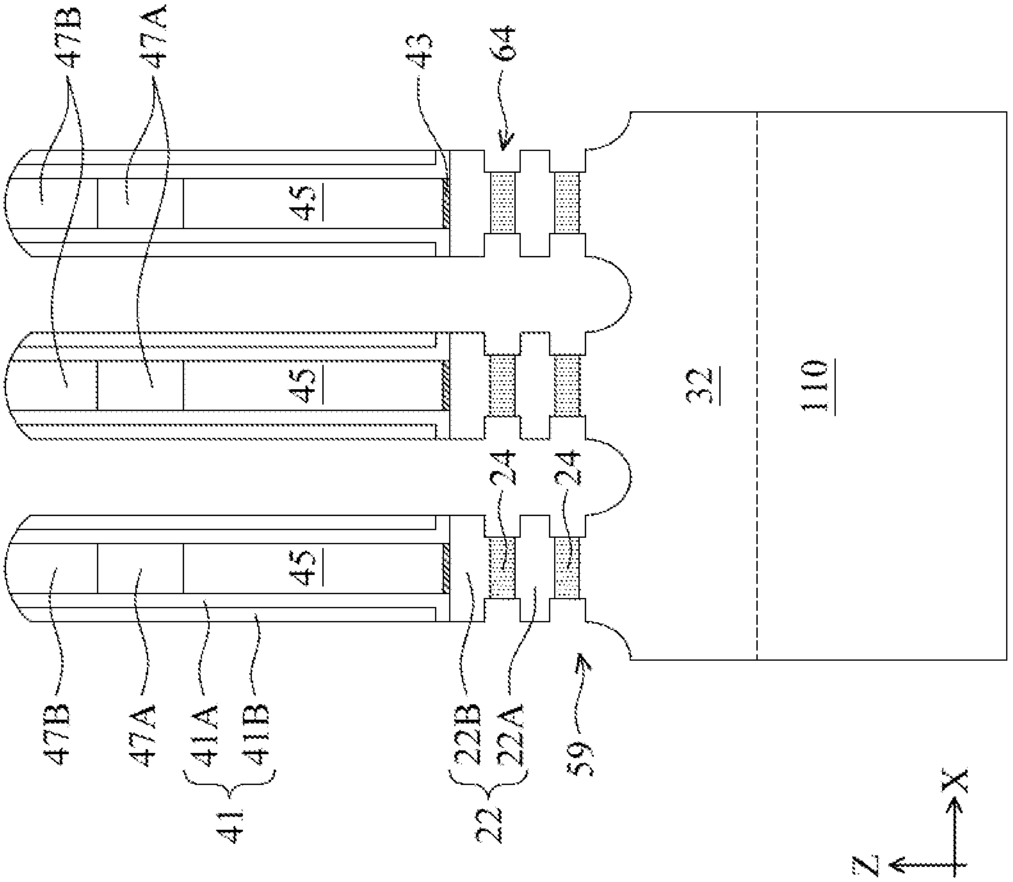

In FIG. 6, a selective etching process is performed to recess end portions of the nanostructures 24 exposed by openings in the spacer layer 41 without substantially attacking the nanostructures 22, corresponding to act 1400 of FIG. 25. After the selective etching process, recesses 64 are formed in the nanostructures 24 at locations where the removed end portions used to be. The resulting structure is shown in FIG. 6.

Figure 7:
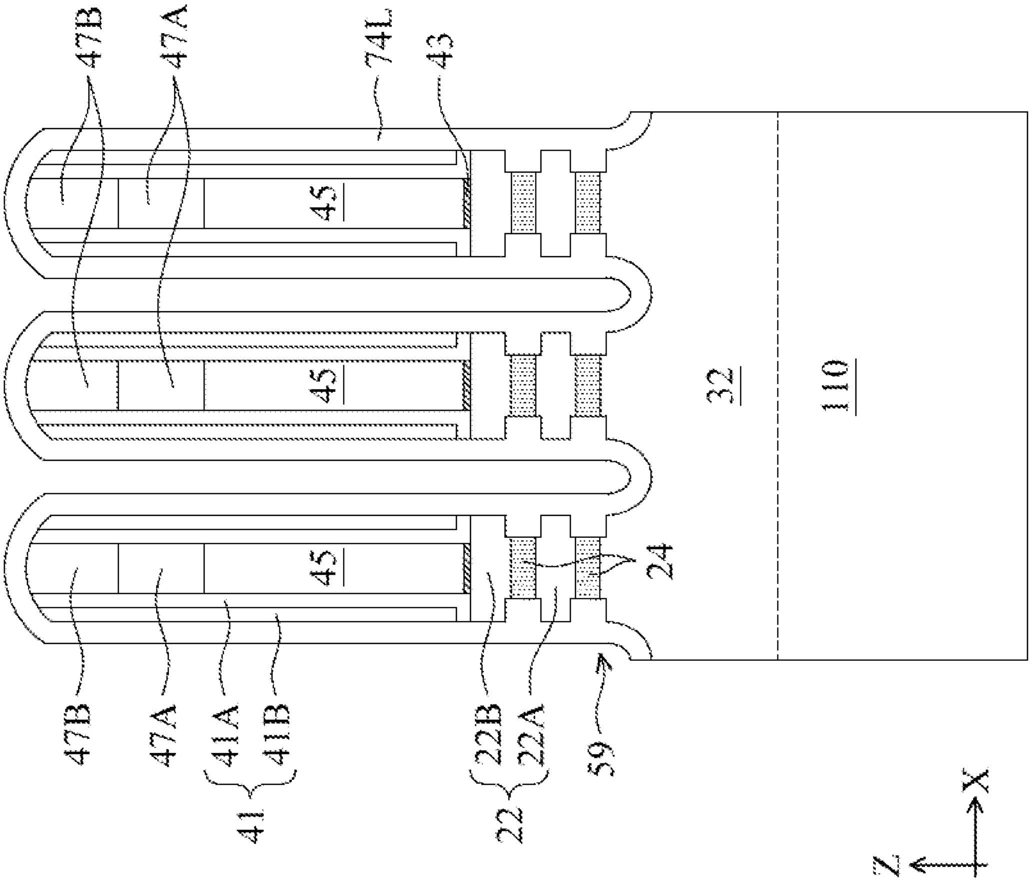

In FIG. 7, following formation of the recesses 64, an inner spacer layer 74L is formed to fill the recesses 64 in the nanostructures 24 formed by the previous selective etching process. The inner spacer layer 74L may be a suitable dielectric material, such as silicon carbon nitride (SiCN), silicon oxycarbonitride (SiOCN), or the like, formed by a suitable deposition method such as PVD, CVD, ALD, or the like.

Figure 8:
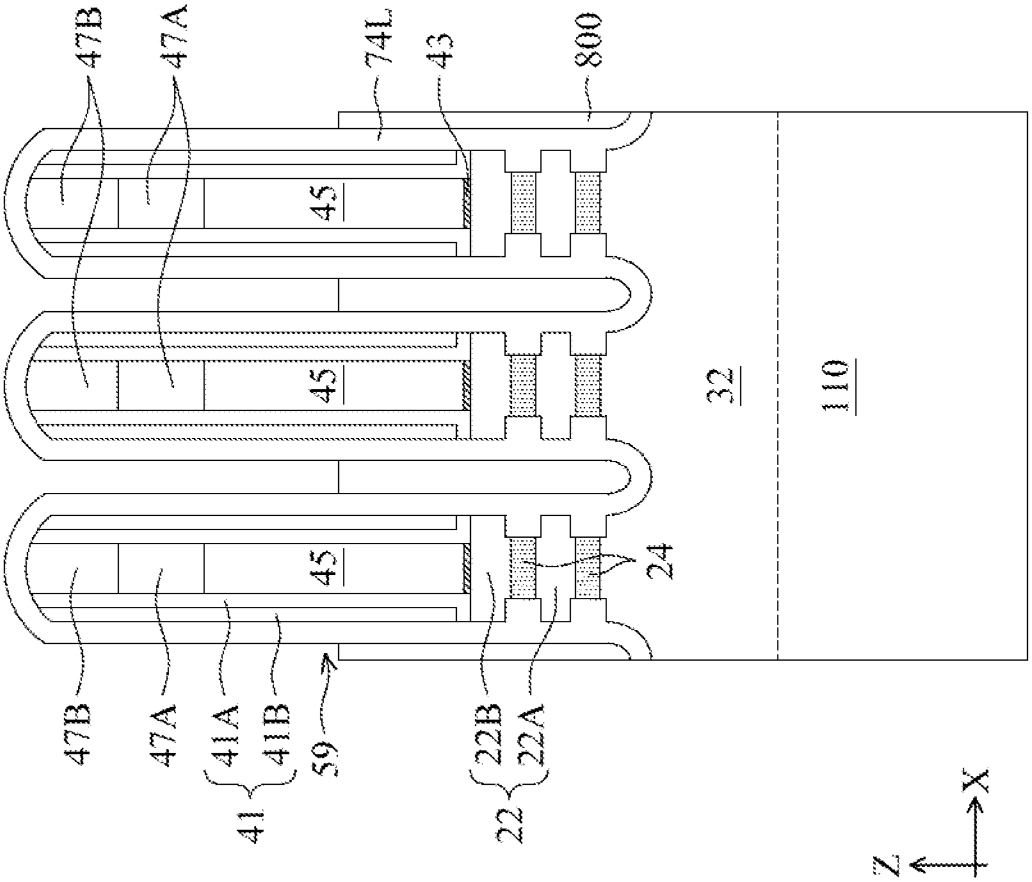

In FIG. 8, following formation of the inner spacer layer 74L, a mask layer 800 is formed that extends to a height that is sufficient to fill the opening 59 partially. The mask layer 800 may be a bottom antireflective coating (BARC) layer or another suitable material layer that has etch selectivity relative to the inner spacer layer 74L. The height may be at a level above the upper surface of the uppermost nanosheet 22B. For example, the mask layer 800 may extend above the upper surface of the uppermost nanosheet 22B by at least 0 nm, at least 1 nm, at least 2 nm, at least 10 nm, or by another suitable distance. In some embodiments, the height that the mask layer 800 extends to is below an upper surface of the sacrificial gate layer 45. When the mask layer 800 extends above the upper surface of the uppermost nanosheet 22B by 0 nm (e.g., the second spacer layer 41B will be removed entirely), complete removal of the second spacer layer 41B may leave insufficient separation between the source/drain contact 120 and the gate structure 200 formed in subsequent operations. As such, in most embodiments, the mask layer 800 extends past the upper surface of the uppermost nanosheet 22B by at least about 1 nm. In some embodiments, the mask layer 800 extends past the upper surface of the uppermost nanosheet 22B by a dimension that is in a range of about 0.1 times to about 0.9 times height of the sacrificial gate layer 45. For example, when the sacrificial gate layer 45 has height of 100 nm, the mask layer 800 extends past the upper surface of the uppermost nanosheet 22B by about 10 nm to about 90 nm. Formation of the mask layer 800 is beneficial to remove partially (e.g., to thin) the gate spacer 41, such as by thinning an upper portion of the second spacer layer 41B.

Figure 9:
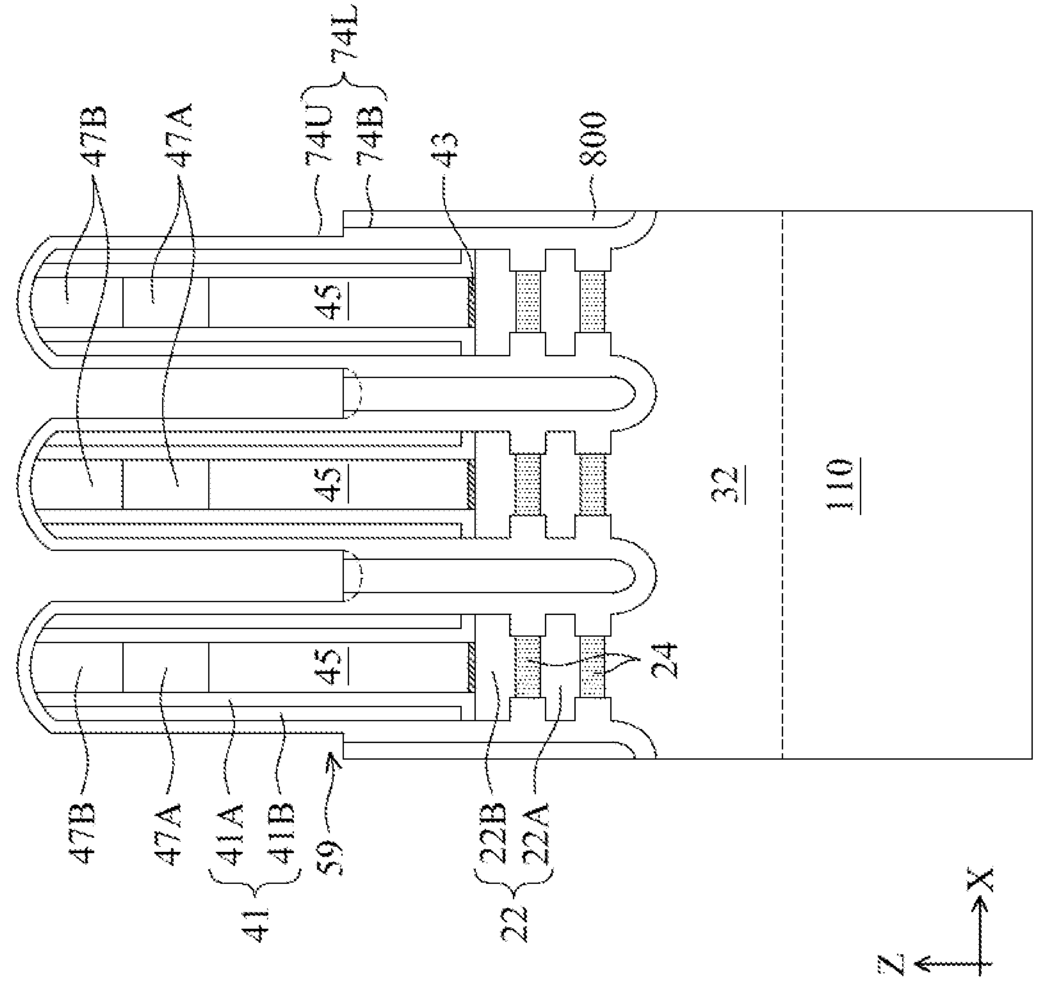

In FIG. 9, following formation of the mask layer 800, a first etch operation is performed that trims portions of the inner spacer layer 74L above the mask layer 800. As a result, the inner spacer layer 74L has bottom portions 74B and upper portions 74U. The bottom portions 74B are thicker than the upper portions 74U. This is beneficial in subsequent operations for thinning or removing upper portions of the gate spacers 41 during formation of the inner spacers 74. In some embodiments, the bottom portions 74B are at least 10%, at least 25%, at least 50% or at least 100% thicker than the upper portions 74U. In some embodiments, the trimming depicted in FIG. 9 removes the upper portions 74U entirely. For example, when etch selectivity between the second spacer layer 41B and the first spacer layer 41A is sufficiently high, presence of the upper portions 74U may not provide additional benefit compared to complete removal thereof.

In FIG. 9, the upper surface of the mask layer 800 is depicted as having a straight, horizontal profile. In some embodiments, the upper surface of the mask layer 800 may be concave following trimming of the inner spacer layer 74L. This is depicted by dashed lines in FIG. 9. The trimmed second spacer layer 41B may also have a transition region that increases in width similar to the concave profile of the mask layer 800, as shown by the dashed lines.

Figure 10:
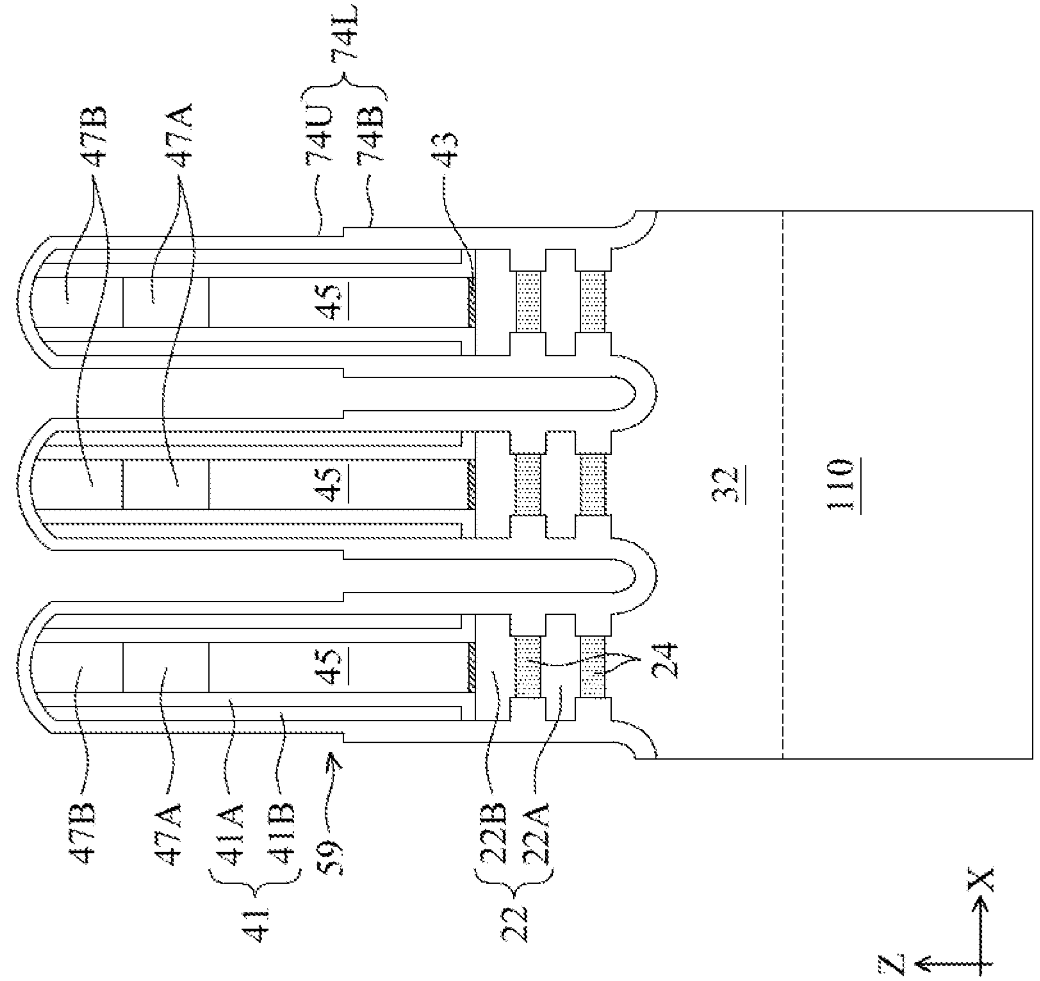

In FIG. 10, the mask layer 800 is removed. Any suitable removal operation may be used to remove the mask layer 800.

Figure 11:
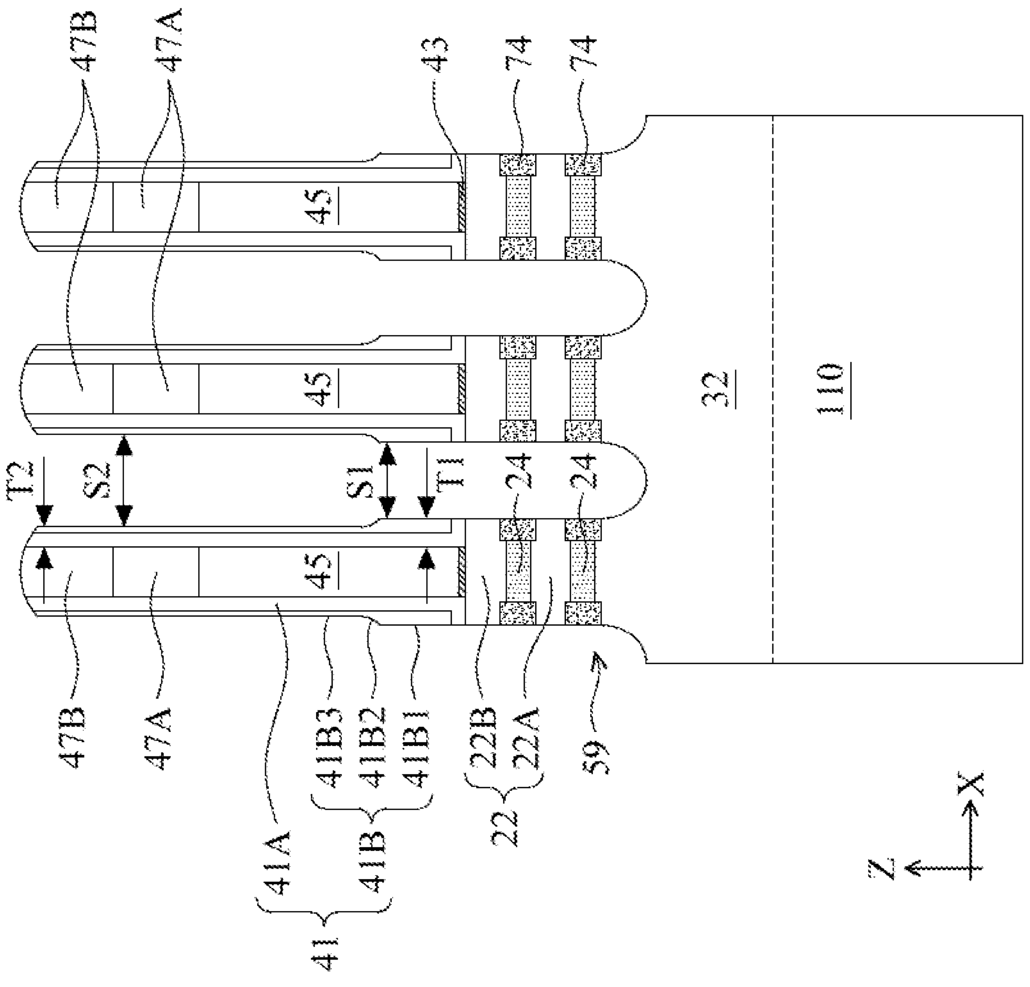

In FIG. 11, the inner spacers 74 are formed while trimming the gate spacer 41, corresponding to act 1500 of FIG. 25. An etching process, such as an anisotropic etching process, is performed to remove portions of the inner spacer layer 74L disposed outside the recesses 64, for example, on sidewalls of the nanostructures 22 and the fins 32. The remaining portions of the inner spacer layer 74L (e.g., portions disposed inside the recesses 64 in the nanostructures 24) form the inner spacers 74. The resulting structure is shown in FIG. 11.

Figure 22:
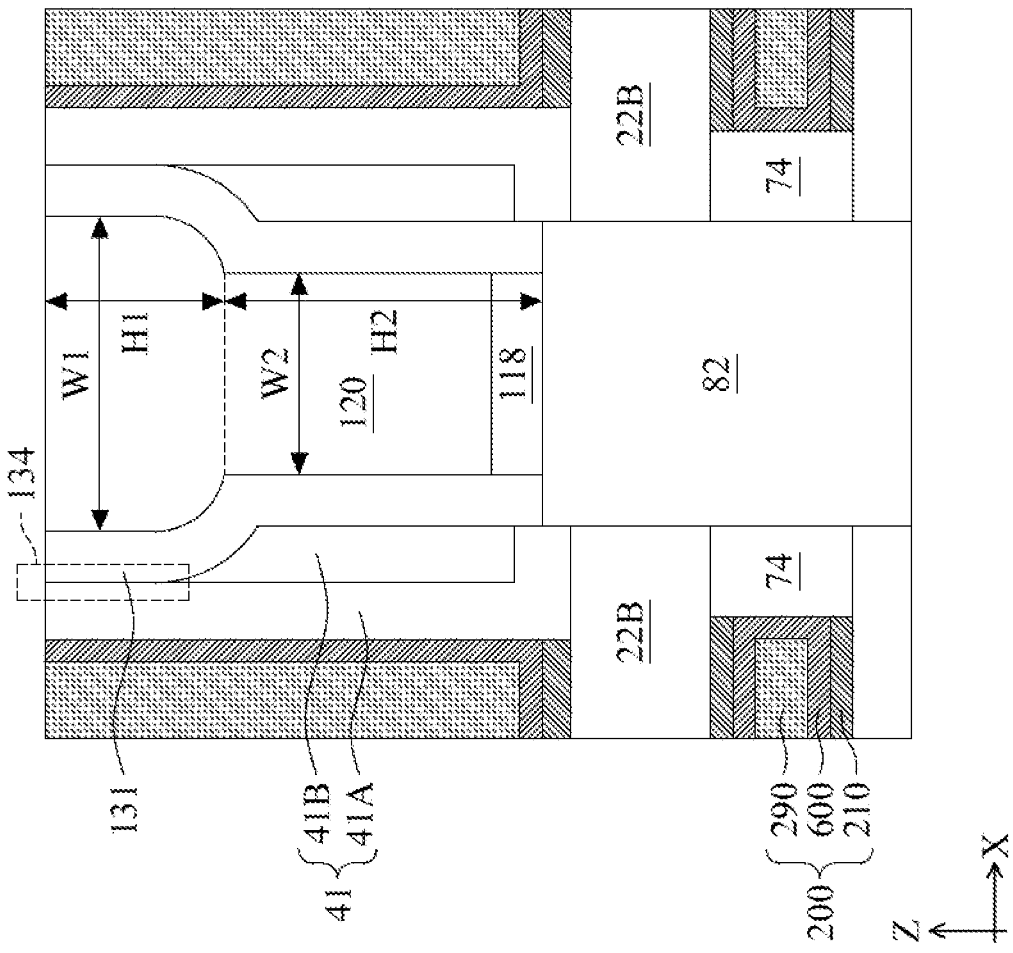
FIGS. 22 and 23 are diagrammatic cross-sectional side views of an IC device in accordance with various embodiments.

During formation of the inner spacers 74 by the etching process, the gate spacer 41 is trimmed. As shown in FIG. 11, lower portions of the gate spacer 41 have first thickness T1 that is greater than second thickness T2 of upper portions of the gate spacer 41. Following the etching process, the second spacer layer 41B may have three portions including a lower portion 41B1, an upper portion 41B3 and a transition portion 41B2 between the lower portion 41B1 and the upper portion 41B3. The transition portion 41B2 may have thickness that thins gradually from the lower portion 41B1 to the upper portion 41B3. In some embodiments, the upper portion 41B3 of the second spacer layer 41B is not present, as depicted in FIG. 22.

Trimming the gate spacers 41 during etching of the inner spacer layer 74L may provide benefits. For example, performing trimming of the gate spacers 41 after source/drain etch, such as during formation of the inner spacers 74 allows for improved control of profile of the gate spacers 41 and avoidance of over etching of the gate spacers 41. For example, it is possible to leave a very thin upper portion 41B3 of the second spacer layer 41B without substantially attacking the first spacer layer 41A.

Following etching of the gate spacers 41, upper portion of the gate spacer 41 are laterally recessed. As such, poly-to-poly openings are T-shaped, as shown. For example, the openings 59 may have first width S1 at lower portions thereof that is smaller than second width S2 at upper portions thereof. In some embodiments, a thickness ratio R1 of the first and second thicknesses T1, T2 of the gate spacers 41 may be expressed as R1=(T1−T2)/T1. In some embodiments, the thickness ratio R1 may be in a range of about 0.075 to about 0.125. In some embodiments, a width ratio R2 of the first and second widths W1, W2 may be expressed as R2=(S2−S1)/S1. In some embodiments, the width ratio R2 may be in a range of about 0.15 to about 0.25.

Figure 12:
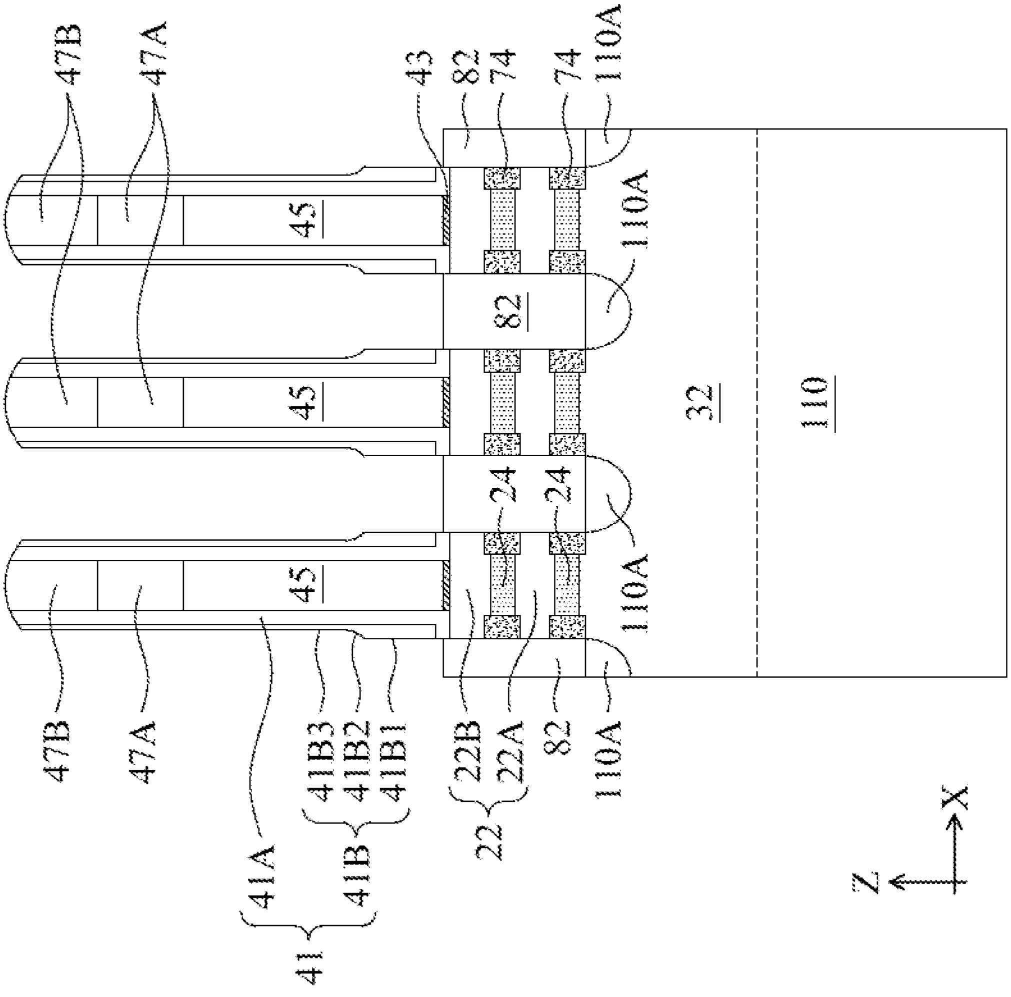

In FIG. 12, following formation of the inner spacers 74 and trimming of the gate spacer 41, source/drain regions 82 are formed, corresponding to act 1600 of FIG. 25. In the illustrated embodiment, the source/drain regions 82 are epitaxially grown from epitaxial material(s). In some embodiments, the source/drain regions 82 exert stress in the respective channels 22A, 22B, thereby improving performance. The source/drain regions 82 are formed such that each dummy gate structure 40 is disposed between respective neighboring pairs of the source/drain regions 82. In some embodiments, the spacer layer 41 separates the source/drain regions 82 from the dummy gate layer 45 by an appropriate lateral distance to prevent electrical bridging to subsequently formed gates of the resulting device. Due to the T-shaped openings 59, source/drain epitaxial window for forming the source/drain regions 82 is improved.

The source/drain regions 82 may be or include SiP, SiAs, SiSb, SiPAs, SiP:As:Sb or the like. In some embodiments, the source/drain regions 82 may be or include SiGe:B, SiGe:B:Ga, SiGe:Sn, SiGe:B:Sn or the like. The source/drain regions 82 may exert a compressive strain in the channel regions. The source/drain regions 82 may have surfaces raised from respective surfaces of the fins and may have facets. Neighboring source/drain regions 82 may merge in some embodiments to form a singular source/drain region 82 adjacent two neighboring fins 32.

In some embodiments, prior to forming the source/drain regions 82, undoped silicon layers 110A are formed in the source/drain openings 59, for example, to a level that is substantially coplanar with the upper surface of the fin 32.

FIGS. 13-18 are diagrammatic cross-sectional side views of forming the inner spacers 74, thinned gate spacers 41 and source/drain regions 82 in accordance with another embodiment. Acts of the method 2000 of FIG. 26 are depicted in FIGS. 13-18.

Figure 13:
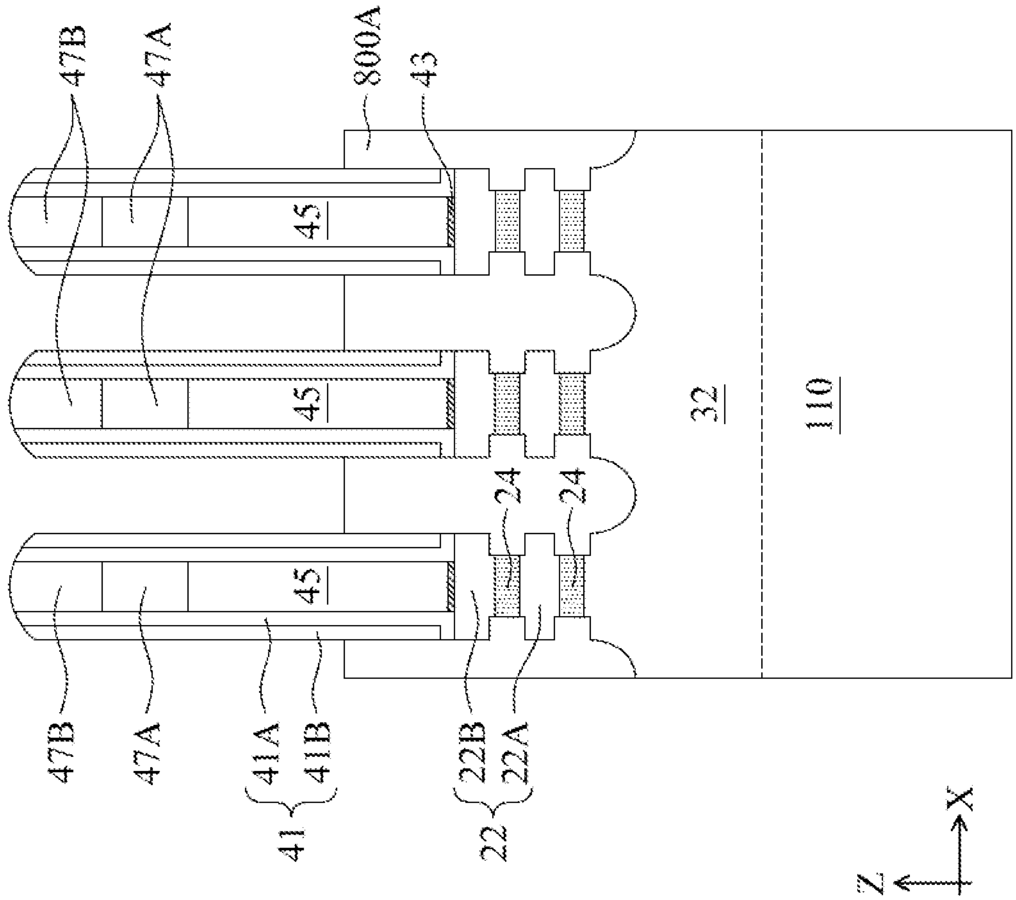
FIGS. 13-18 are views of various embodiments of an IC device at various stages of fabrication according to various aspects of the present disclosure.

In FIG. 13, prior to forming the inner spacer layer 74L, a mask layer 800A is formed. The mask layer 800A may be similar in most respects to the mask layer 800. Because the mask layer 800A is formed prior to forming the inner spacer layer 74L, the mask layer 800A may extend into the recesses 64, as shown.

Figure 14:
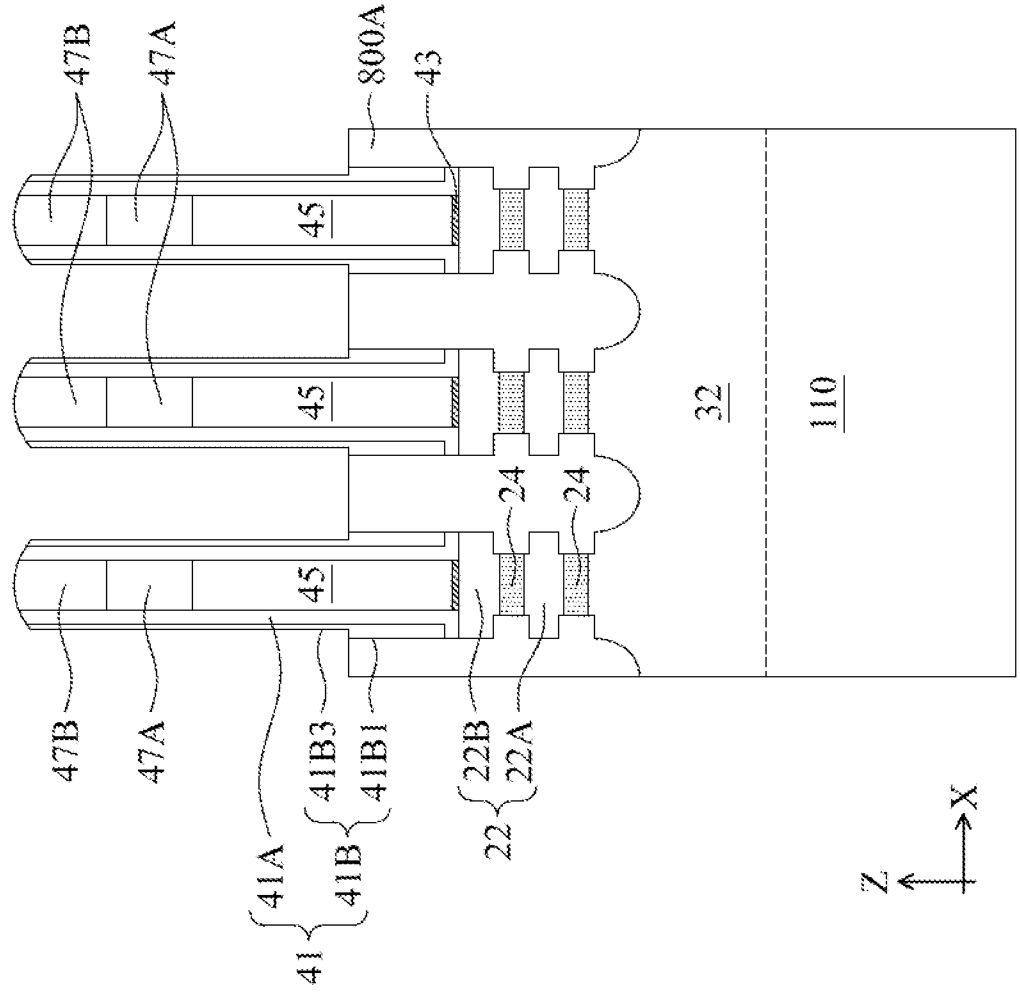

In FIG. 14, following formation of the mask layer 800A, the gate spacers 41 are trimmed, corresponding to act 2510 of FIG. 26. During trimming of the gate spacers 41, an etch operation that is selective to the gate spacers 41 while not substantially attacking the mask layer 800A may be performed. The etch operation may be an isotropic etch, such as a wet etch. Following the etch operation, the second spacer layer 41B may be thinned or removed. Details of structure, dimensions and ratios of the gate spacers 41 including the second spacer layer 41B may be similar in most respects to those described with reference to FIG. 11.

Figure 15:
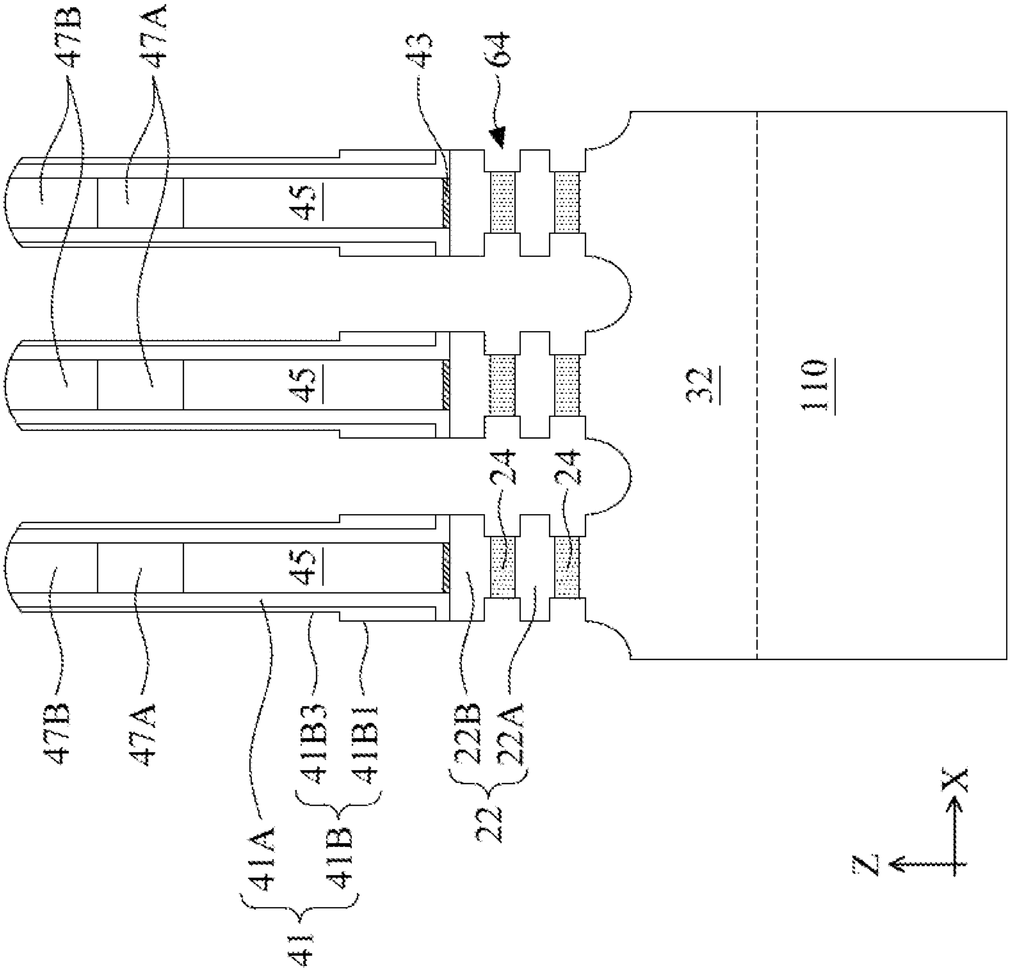

In FIG. 15, following trimming of the gate spacers 41, the mask layer 800A is removed by a suitable removal operation.

Figure 16:
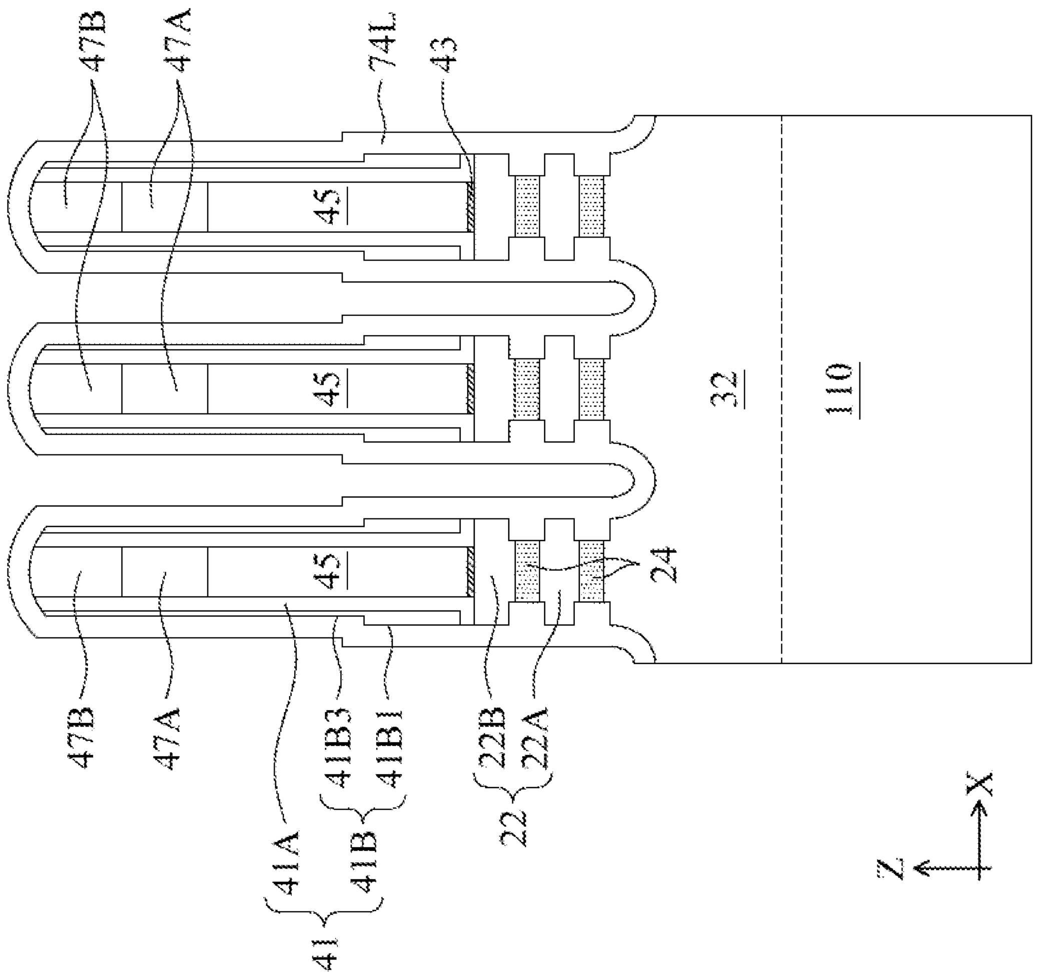
Figure 17:
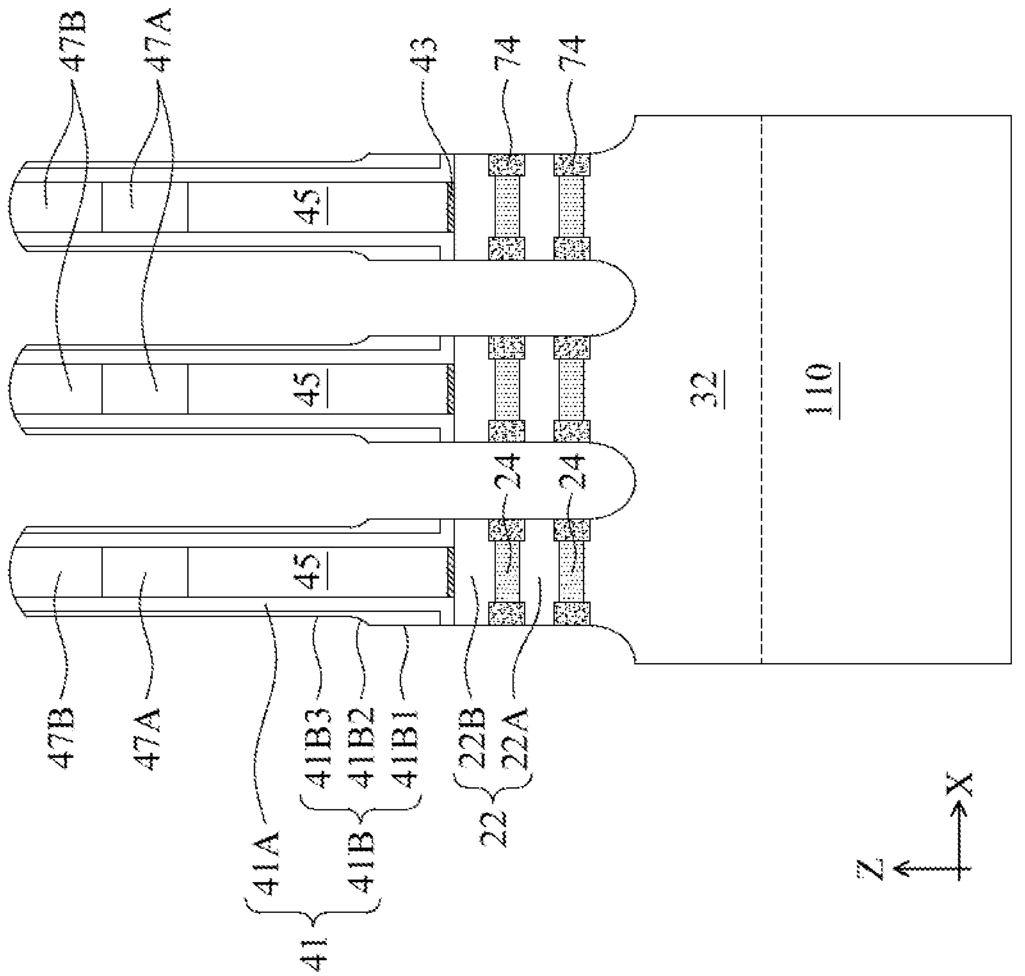

In FIGS. 16 and 17, the inner spacers 74 are formed, corresponding to act 2520 of FIG. 26. In FIG. 16, the inner spacer layer 74L is formed, which is similar in most respects to what is described with reference to FIG. 7. In FIG. 16, due to the gate spacers 41 being trimmed prior to formation of the inner spacer layer 74L, the inner spacer layer 74L has a step region where the upper portion 41B3 of the second spacer layer 41B transitions to the lower portion 41B1 of the second spacer layer 41B.

In FIG. 17, following formation of the inner spacer layer 74L, the inner spacers 74 are formed by removing the inner spacer layer 74L outside of the recesses 64. This is similar to what is described with reference to FIG. 11, except that, due to the thickness of the inner spacer layer 74L being substantially uniform in FIG. 17, the gate spacers 41 are not substantially trimmed further during removal of the excess portions of the inner spacer layer 74L outside of the recesses 64.

Figure 18:
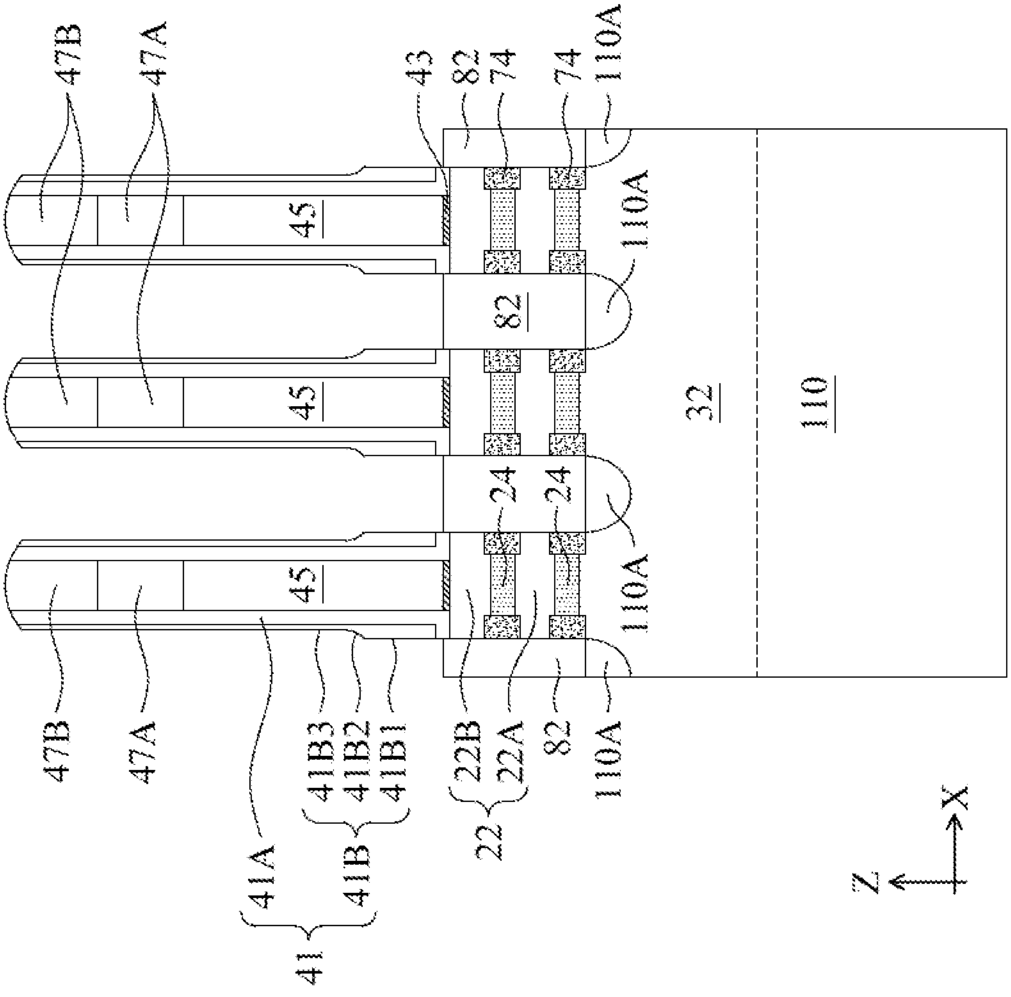

In FIG. 18, following formation of the inner spacers 74, the source/drain regions 82 and undoped silicon layers 110A are formed, which is similar in most respects to that described with reference to FIG. 12.

FIGS. 19-21B are diagrammatic cross-sectional side views of forming the inner spacers 74 and thinned gate spacers 41 in accordance with another embodiment. Acts of the method 3000 of FIG. 27 are depicted in FIGS. 19-21B. Formation of source/drain regions 82 is omitted in the following description but can be understood from the description of FIG. 12 above.

Figure 19:
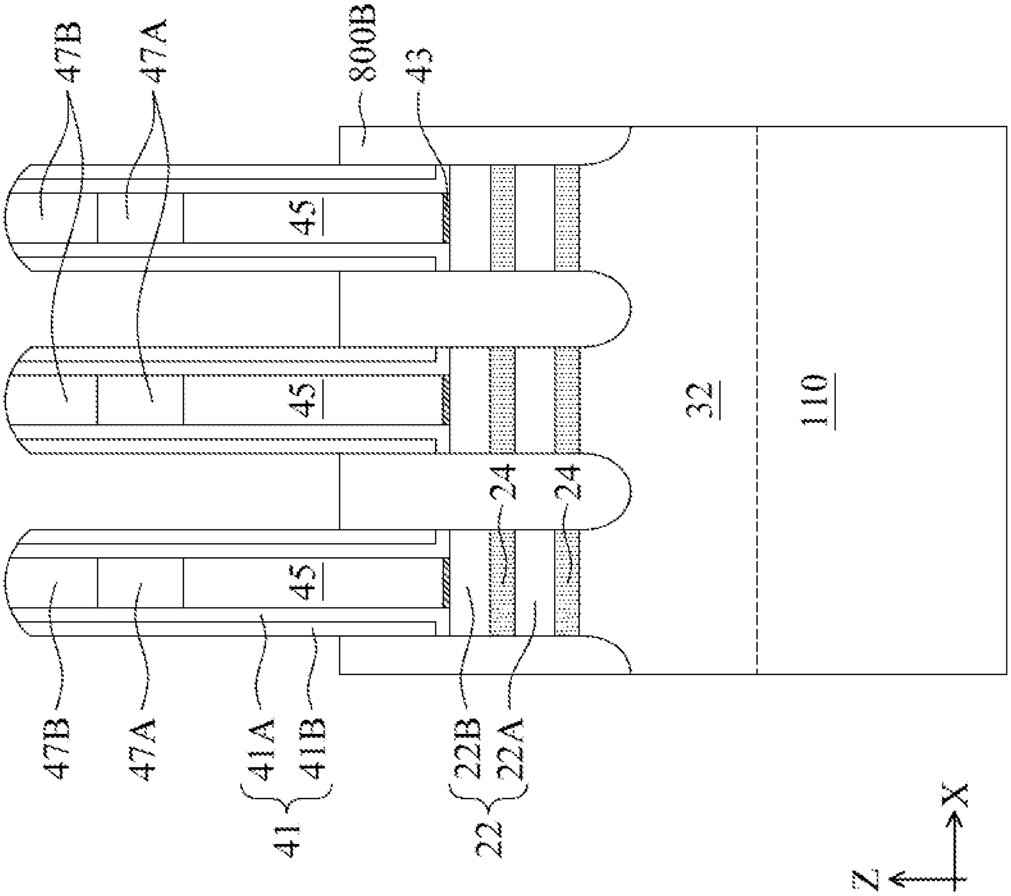
FIGS. 19-21B are views of various embodiments of an IC device at various stages of fabrication according to various aspects of the present disclosure.

In FIG. 19, following formation of the source/drain openings 59 and prior to formation of the recesses 64, a mask layer 800B is formed. The mask layer 800B is similar in most respects to the mask layers 800 and 800A, and description thereof is provided with reference to FIG. 9. Because the mask layers 800 and 800A are formed prior to formation of the recesses 64, the mask layer 800B has slightly different shape than the mask layer 800B.

Figure 20:
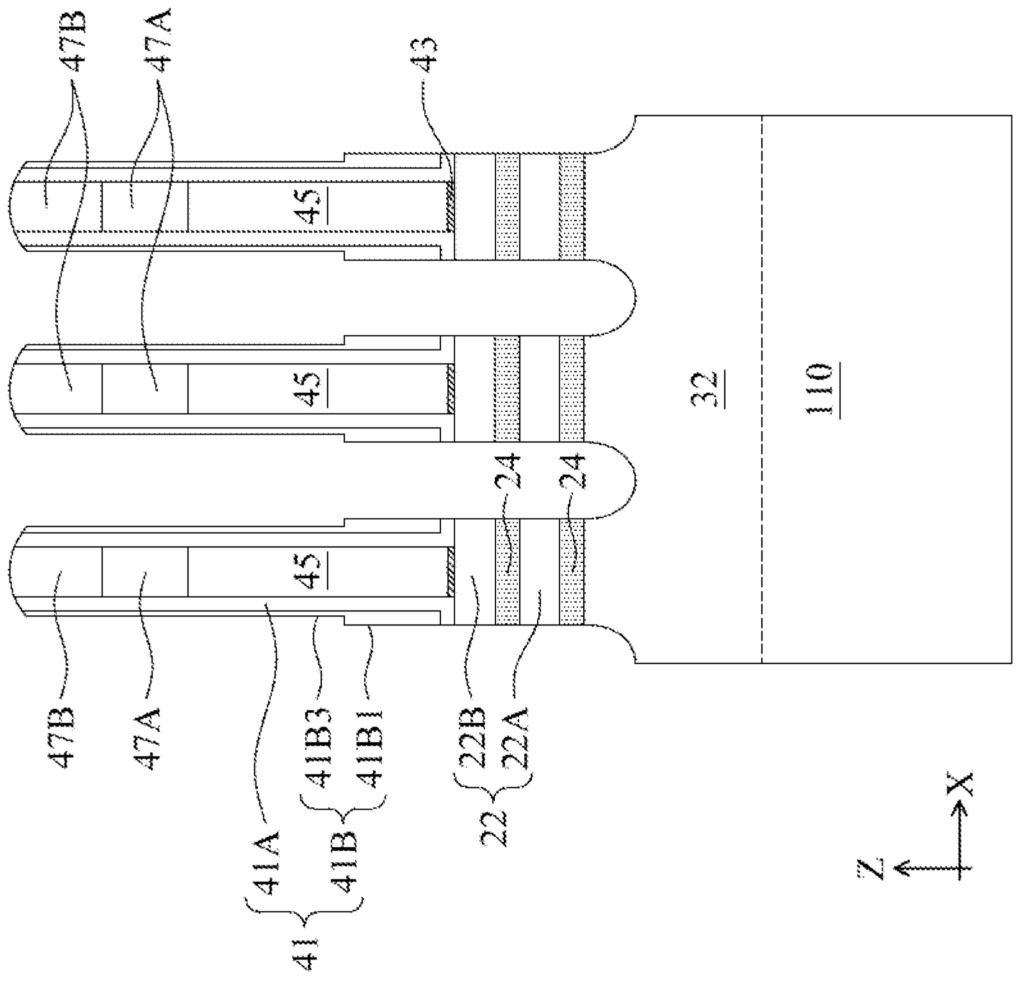

In FIG. 20, following formation of the mask layer 800B, the gate spacers 41 are trimmed (e.g., thinned or removed), corresponding to act 3510 of FIG. 27. Following trimming of the gate spacers 41, the mask layer 800B is removed by any suitable process. During trimming of the gate spacers 41, an etch operation that is selective to the gate spacers 41 while not substantially attacking the mask layer 800B may be performed. The etch operation may be an isotropic etch, such as a wet etch. Following the etch operation, the second spacer layer 41B may be thinned or removed. Details of structure, dimensions and ratios of the gate spacers 41 including the second spacer layer 41B may be similar in most respects to those described with reference to FIG. 11.

Figure 21A:
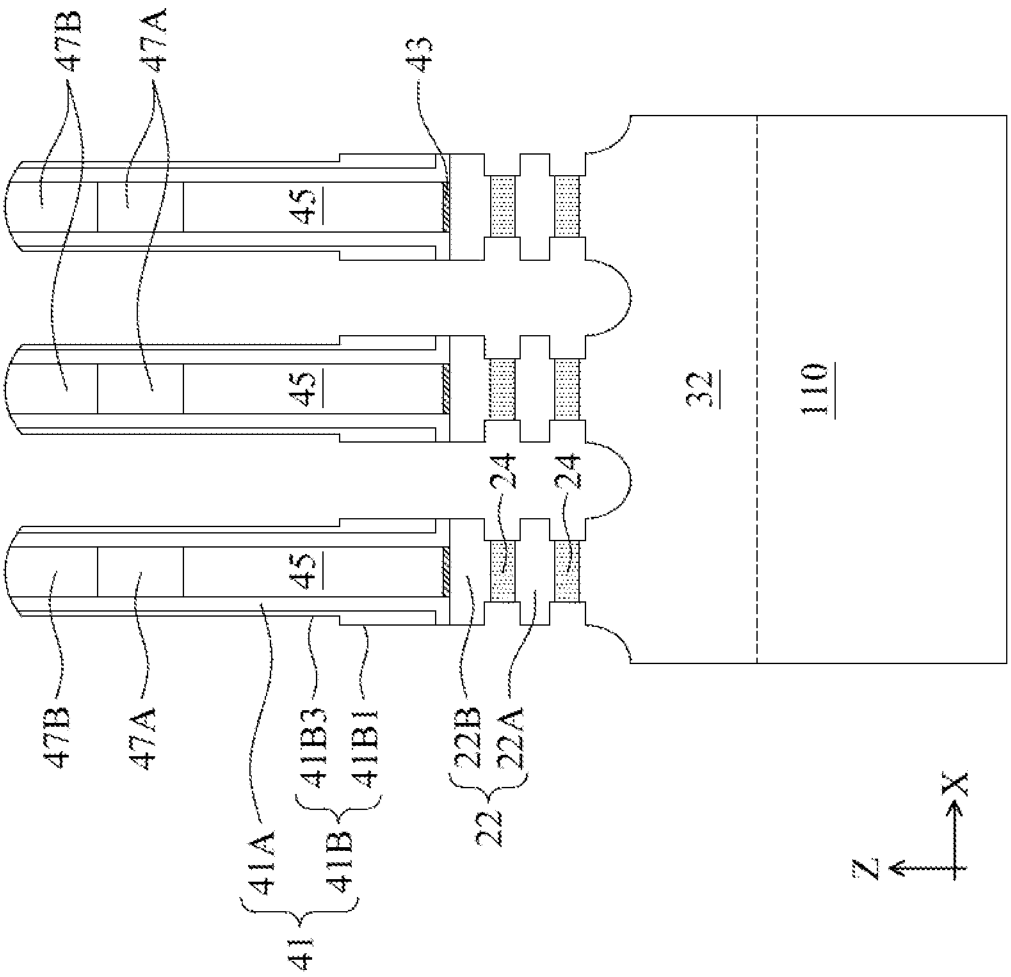

In FIG. 21A, following trimming of the gate spacers 41 and removal of the mask layer 800B, inner spacer recesses 64 are formed, corresponding to act 3400 of FIG. 27. Formation of the inner spacer recesses 64 may be similar in most respects to that described with reference to FIG. 6.

Although not separately depicted, following formation of the recesses 64 in FIG. 21A, similar operations to those depicted in and described with reference to FIG. 16, FIG. 17 and FIG. 18 may be performed to form the inner spacers 74 (act 3520) and form the source/drain regions 82.

Figure 21B:
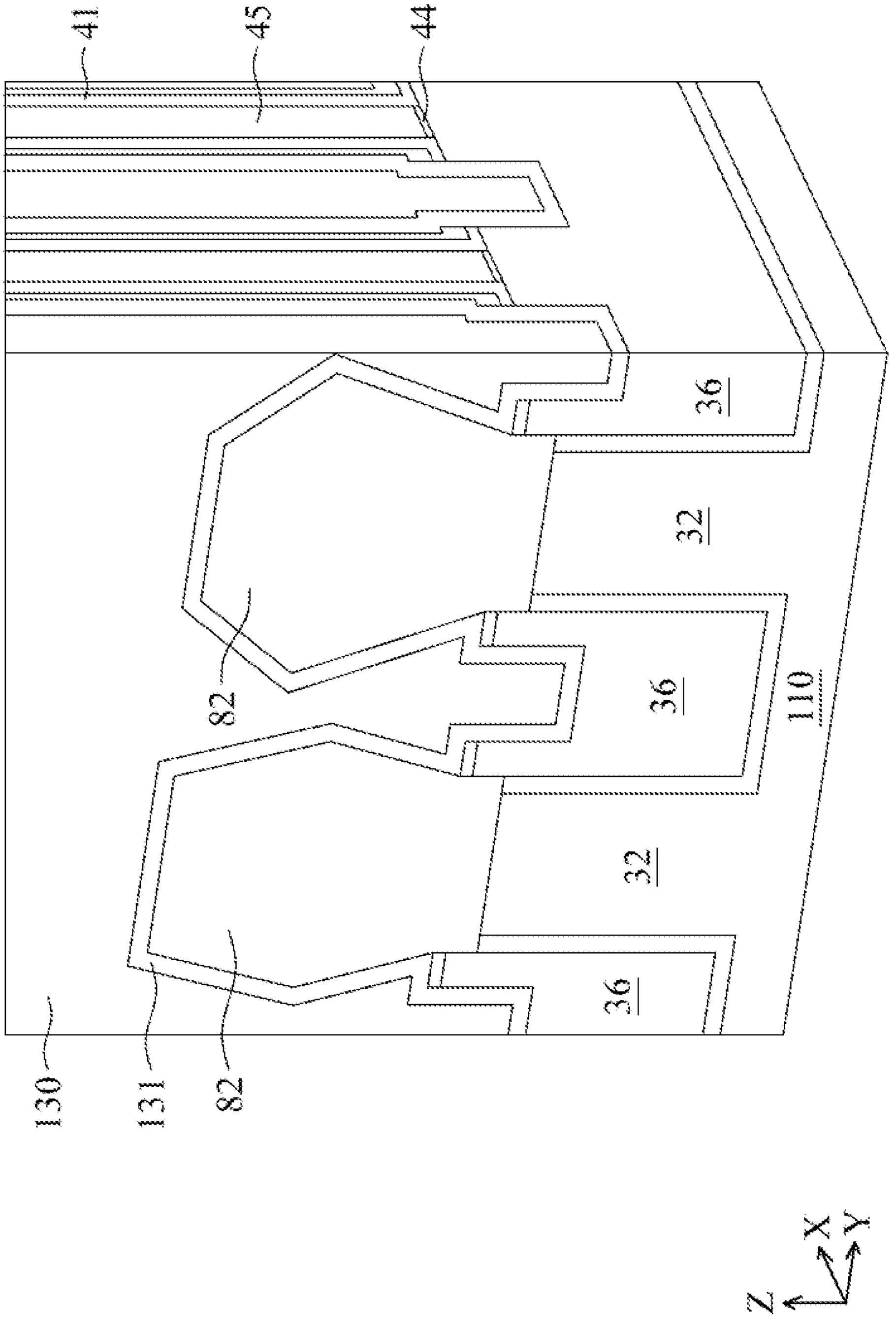

In each of the methods 1000, 2000, 3000, as depicted in FIG. 21B, following formation of the source/drain regions 82, the ILD 130 may be formed covering the source/drain regions 82 and abutting the spacer layer 41. In some embodiments, the ESL 131 is formed prior to forming the ILD 130. The ESL 131 may be formed by depositing a conformal thin layer of a dielectric material different from that of the ILD, such as one or more of SiN, SiCN, SiC, SiOC, SiOCN, $HfO_2$, $ZrO_2$, $ZrAlO_x$, $HfAlO_x$, $HfSiO_x$, $Al_2O_3$, or other suitable material. Following deposition of the ESL 131, the ILD 130 may be deposited by a suitable process, such as a blanket deposition process, including PVD, CVD, ALD, or the like. The material of the ILD 130 may include silicon dioxide or a low-k dielectric material (e.g., a material having a dielectric constant (k-value) lower than the k-value (about 3.9) of silicon dioxide). The low-k dielectric material may include silicon oxynitride, phosphosilicate glass (PSG), borosilicate glass (BSG), borophosphosilicate glass (BPSG), undoped silicate glass (USG), fluorinated silicate glass (FSG), silicon oxycarbide ($SiO_xC_y$), Spin-On-Glass (SOG) or a combination thereof. The ILD may be deposited by spin-on coating, CVD, Flowable CVD (FCVD), PECVD, PVD, or another deposition process.

Figure 23:
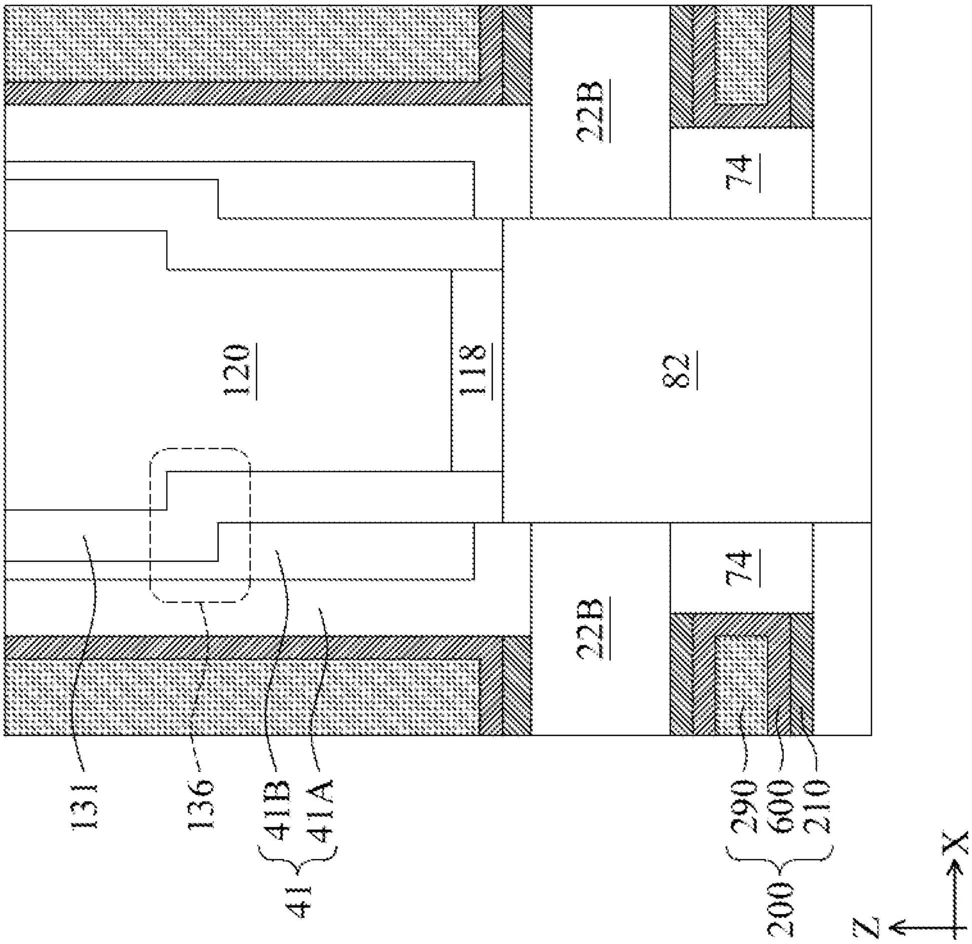

Referring to FIGS. 22 and 23, then, active gate structures 200 may be formed. A planarization process, such as a chemical mechanical polishing (CMP) process, is performed on the ILD and the ESL 131. The hard masks 47A, 47B and portions of the gate spacers 41 are also removed in the planarization process. After the planarization process, the dummy gate layers 45 are exposed. The top surfaces of the ILD and the ESL 131 may be coplanar with the top surfaces of the dummy gate layers 45 and the gate spacers 41.

Next, the dummy gate layer 45 is removed in an etching process, so that recesses are formed. In some embodiments, the dummy gate layer 45 is removed by an anisotropic dry etch process. For example, the etching process may include a dry etch process using reaction gas(es) that selectively etch the dummy gate layer 45 without etching the spacer layer 41. The dummy gate dielectric 43, when present, may be used as an etch stop layer when the dummy gate layer 45 is etched. The dummy gate dielectric 43 may then be removed after the removal of the dummy gate layer 45.

The nanostructures 24 are removed to release the nanostructures 22. After the nanostructures 24 are removed, the nanostructures 22 form a plurality of nanosheets that extend horizontally (e.g., parallel to a major upper surface of the substrate 110). In some embodiments, the nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises $F_2$ and HF, and the carrier gas may be an inert gas such as Ar, He, $N_2$, combinations thereof, or the like.

In some embodiments, the nanostructures 24 are removed and the nanostructures 22 are patterned to form channel regions of both PFETs and NFETs. However, in some embodiments the nanostructures 24 may be removed and the nanostructures 22 may be patterned to form channel regions of NFETs, and nanostructures 22 may be removed and the nanostructures 24 may be patterned to form channel regions of PFETs. In some embodiments, the nanostructures 22 may be removed and the nanostructures 24 may be patterned to form channel regions of NFETs, and the nanostructures 24 may be removed and the nanostructures 22 may be patterned to form channel regions of PFETs. In some embodiments, the nanostructures 22 may be removed and the nanostructures 24 may be patterned to form channel regions of both PFETs and NFETs.

In some embodiments, the nanosheets 22 are reshaped (e.g., thinned) by a further etching process to improve gate fill window. The reshaping may be performed by an isotropic etching process selective to the nanosheets 22. After reshaping, the nanosheets 22 may exhibit the dog bone shape in which middle portions of the nanosheets 22 are thinner than peripheral portions of the nanosheets 22 along the X direction.

Then, replacement gates 200 are formed. The gate structures 200 may be formed by a series of deposition operations, such as ALD cycles, that deposit the various layers of the gate structure 200 in the openings, described below with reference to FIG. 24.

FIG. 24 is a detailed view of a portion of the gate structure 200. The gate structure 200 generally includes the interfacial layer (IL, or "first IL" below) 210, at least one gate dielectric layer 600, the work function metal layer 900, and the gate fill layer 290. In some embodiments, each replacement gate 200 further includes at least one of a second interfacial layer 240 or a second work function layer 700.

With reference to FIG. 24, in some embodiments, the first IL 210 includes an oxide of the semiconductor material of the substrate 110, e.g., silicon oxide. In other embodiments, the first IL 210 may include another suitable type of dielectric material. The first IL 210 has a thickness in a range between about 5 angstroms and about 50 angstroms.

Still referring to FIG. 24, the gate dielectric layer 600 is formed over the first IL 210. In some embodiments, an atomic layer deposition (ALD) process is used to form the gate dielectric layer 600 to control thickness of the deposited gate dielectric layer 600 with precision. In some embodiments, the ALD process is performed using between about 40 and 80 deposition cycles, at a temperature range between about 200 degrees Celsius and about 300 degrees Celsius. In some embodiments, the ALD process uses $HfCl_4$ and/or $H_2O$ as precursors. Such an ALD process may form the gate dielectric layer 600 to have a thickness in a range between about 10 angstroms and about 100 angstroms.

In some embodiments, the gate dielectric layer 600 includes a high-k dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In other embodiments, the gate dielectric layer 600 may include a non-high-k dielectric material such as silicon oxide. In some embodiments, the gate dielectric layer 600 includes more than one high-k dielectric layer, of which at least one includes dopants, such as lanthanum, magnesium, yttrium, or the like, which may be driven in by an annealing process to modify threshold voltage of the nanostructure devices 20A-20C.

With further reference to FIG. 24, the second IL 240 is formed on the gate dielectric layer 600, and the second work function layer 700 is formed on the second IL 240. The second IL 240 promotes better metal gate adhesion on the gate dielectric layer 600. In many embodiments, the second IL 240 further provides improved thermal stability for the gate structure 200, and serves to limit diffusion of metallic impurity from the work function metal layer 900 and/or the work function barrier layer 700 into the gate dielectric layer 600. In some embodiments, formation of the second IL 240 is accomplished by first depositing a high-k capping layer (not illustrated for simplicity) on the gate dielectric layer 600. The high-k capping layer comprises one or more of the following: HfSiON, HfTaO, HfTiO, HfTaO, HfAlON, HfZrO, or other suitable materials, in various embodiments. In a specific embodiment, the high-k capping layer comprises titanium silicon nitride (TiSiN). In some embodiments, the high-k capping layer is deposited by an ALD using about 40 to about 100 cycles at a temperature of about 400 degrees C. to about 450 degrees C. A thermal anneal is then performed to form the second IL 240, which may be or comprise TiSiNO, in some embodiments. Following formation of the second IL 240 by thermal anneal, an atomic layer etch (ALE) with artificial intelligence (AI) control may be performed in cycles to remove the high-k capping layer while substantially not removing the second IL 240. Each cycle may include a first pulse of $WCl_5$, followed by an Ar purge, followed by a second pulse of $O_2$, followed by another Ar purge. The high-k capping layer is removed to increase gate fill window for further multiple threshold voltage tuning by metal gate patterning.

Further in FIG. 24, after forming the second IL 240 and removing the high-k capping layer, the work function barrier layer 700 is optionally formed on the gate structure 200, in accordance with some embodiments. The work function barrier layer 700 is or comprises a metal nitride, such as TiN, WN, MON, TaN, or the like. In a specific embodiment, the work function barrier layer 700 is TiN. The work function barrier layer 700 may have thickness ranging from about 5 A to about 20 A. Inclusion of the work function barrier layer 700 provides additional threshold voltage tuning flexibility. In general, the work function barrier layer 700 increases the threshold voltage for NFET transistor devices, and decreases the threshold voltage (magnitude) for PFET transistor devices.

The work function metal layer 900, which may include at least one of an N-type work function metal layer, an in-situ capping layer, or an oxygen blocking layer, is formed on the work function barrier layer 700, in some embodiments. The N-type work function metal layer is or comprises an N-type metal material, such as TiAlC, TiAl, TaAlC, TaAl, or the like. The N-type work function metal layer may be formed by one or more deposition methods, such as CVD, PVD, ALD, plating, and/or other suitable methods, and has a thickness between about 10 A and 20 A. The in-situ capping layer is formed on the N-type work function metal layer. In some embodiments, the in-situ capping layer is or comprises TIN, TiSiN, TaN, or another suitable material, and has a thickness between about 10 A and 20 A. The oxygen blocking layer is formed on the in-situ capping layer to prevent oxygen diffusion into the N-type work function metal layer, which would cause an undesirable shift in the threshold voltage. The oxygen blocking layer is formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the oxygen blocking layer is formed using ALD and has a thickness between about 10 A and about 20 A.

FIG. 24 further illustrates the metal core layer 290. In some embodiments, a glue layer (not separately illustrated) is formed between the oxygen blocking layer of the work function metal layer and the metal core layer 290. The glue layer may promote and/or enhance the adhesion between the metal core layer 290 and the work function metal layer 900. In some embodiments, the glue layer may be formed of a metal nitride, such as TiN, TaN, MON, WN, or another suitable material, using ALD. In some embodiments, thickness of the glue layer is between about 10 A and about 25 A. The metal core layer 290 may be formed on the glue layer, and may include a conductive material such as tungsten, cobalt, ruthenium, iridium, molybdenum, copper, aluminum, or combinations thereof. In some embodiments, the metal core layer 290 may be deposited using methods such as CVD, PVD, plating, and/or other suitable processes. In some embodiments, a seam 510, which may be an air gap, is formed in the metal core layer 290 vertically between the channels 22A, 22B. In some embodiments, the metal core layer 290 is conformally deposited on the work function metal layer 900. The seam 510 may form due to sidewall deposited film merging during the conformal deposition. In some embodiments, the seam 510 is not present between the neighboring channels 22A, 22B.

Following formation of the gate structures 200, source/drain openings may be formed in the ILD and source/drain contacts 120 may be formed in the source/drain openings. The resulting structure is shown in FIG. 22. Silicide regions 118 and the source/drain contacts 120 are formed on the source/drain regions 82.

In some embodiments, the silicide layers 118 are formed prior to formation of the source/drain contacts 120. For example, an N-type or P-type metal layer may be formed as a conformal thin layer over exposed portions of the source/drain regions 82. The metal layer may be or include one or more of Ni, Co, Mn, W, Fe, Rh, Pd, Ru, Pt, Ir, Os or the like. In some embodiments, the metal layer is or includes one or more of Ti, Cr, Ta, Mo, Zr, Hf, Sc, Ys, Ho, Tb, Gd, Lu, Dy, Er, Yb or another suitable material. Following formation of the metal layer, the silicide layers 118 may be formed by annealing the device 10. Following the anneal, the silicide layers 118 may be or include one or more of NiSi, CoSi, MnSi, Wsi, FeSi, RhSi, PdSi, RuSi, PtSi, IrSi, OsSi, TiSi, CrSi, TaSi, MoSi, ZrSi, HfSi, ScSi, Ysi, HoSi, TbSI, GdSi, LuSi, DySi, ErSi, YbSi or the like. Silicide of the silicide layers 118 may diffuse into regions below the ESL 131. Thickness of the silicide layers 118 may be in a range of about 1 nm to about 10 nm. Below about 1 nm, contact resistance may be too high. Above about 10 nm, the silicide layers 118 may short with the channels 22B.

Following formation of the silicide layers 118, the source/drain contacts 120 are formed by filling the openings over the source/drain regions 82 with, for example, a liner layer and a fill layer. In some embodiments, the source/drain contacts 120 are formed by depositing a material that is or includes a conductive material such as Co, W, Ru, combinations thereof, or the like. In some embodiments, the source/drain contacts 120 are or include a Co-, W- or Ru-based compound or alloy including one or more elements, such as Zr, Sn, Ag, Cu, Au, Al, Ca, Be, Mg, Rh, Na, Ir, W, Mo, Zn, Ni, K, Co, Cd, Ru, In, Os, Si, Ge, Mn, combinations thereof, or the like. The source/drain contacts 120 land on the silicide layer 118 and are in contact with the ESL 131. Description of the device 10 and illustration thereof in many of the figures is given with reference to GAAFETs including vertical stacks of the nanostructures 22. In some embodiments, the silicide layers 118 and the source/drain contacts 120 are formed in and on source/drain regions 82 of FinFET devices.

FIG. 22 depicts a source/drain contact 120 that is separated from the gate structure 200 by the gate spacer 41 and the ESL 131. In the embodiment depicted in FIG. 22, the upper portion 41B3 of the second spacer layer 41B is not present, such that the ESL 131 is in direct contact with the first spacer layer 41A and upper surfaces of the second spacer layer 41B. This is depicted by a region 134 outlined in phantom in FIG. 22. The upper portion of the second spacer layer 41B may be removed entirely during inner spacer trimming depicted in FIG. 11 or during spacer trimming depicted in FIG. 17, thereby exposing the first spacer layer 41A.

FIG. 22 depicts widths W1, W2 and heights H1, H2 of the source/drain contact 120. The width W1 and the height H1 are a width and height of an upper portion of the source/drain contact 120, respectively. The width W2 and the height H2 are a width and height of a lower portion of the source/drain contact 120, respectively. The source/drain contact 120 may be T-shaped, namely W1>W2. In some embodiments, a width ratio R3 of the first and second widths W1, W2 may be expressed as (W1−W2)/W2. The width ratio R3 may be in a range of about 0.15 to about 0.25, which is beneficial to lower contact resistance and improve gap-fill ability. The height H1 may be greater than, less than or equal to the height H2. A height ratio R4 of the first and second heights H1, H2 may be expressed as H1/(H1+H2). The height ratio R4 may be in a range of about 0.5 to about 0.95.

FIG. 23 depicts that the ESL 131 may include a step portion on a region of transition between the lower portion 41B1 and the upper portion 41B3 of the second spacer layer 41B. This is depicted by a region 136 outlined in phantom in FIG. 23. The transition portion 41B2 may not be present between the thinner and wider portions (e.g., the portions 41B3, 41B1) of the gate spacer 41 due to the mask layer 800 (or the mask layer 800A, 800B) being substantially unrecessed during spacer trimming, for example, as depicted in FIG. 11 and FIG. 14.

Additional processing may be performed to finish fabrication of the nanostructure devices 20. For example, gate contacts (or gate vias) may be formed to electrically couple to the gate structures 200. An interconnect structure may then be formed over the source/drain contacts 120 and the gate contacts. The interconnect structure may include a plurality of dielectric layers (including, for example, a second ILD) surrounding metallic features, including conductive traces and conductive vias, which form electrical connection between devices on the substrate 110, such as the nanostructure devices 20, as well as to IC devices external to the IC device 10.

Embodiments may provide advantages. Due to the reduced aspect ratio of the source/drain openings 59 that results from trimming of the gate spacers 41, source/drain region 82 epitaxial growth window is increased and formation of epitaxial nodules on the gate spacers 41 is prevented. Collapse of the sacrificial gate layers 45 may also be prevented.

In accordance with at least one embodiment, a device comprises: a stack of semiconductor channels; a gate structure wrapping around the semiconductor channels; a source/drain region abutting the semiconductor channels; a source/drain contact on the source/drain region; and a gate spacer between the source/drain contact and the gate structure. The gate spacer includes: a first spacer layer in contact with the gate structure; and a second spacer layer between the first spacer layer and the source/drain contact, the second spacer layer having a first portion on the stack and a second portion on the first portion, the second portion being thinner than the first portion.

In accordance with at least one embodiment, a method comprises: forming a sacrificial gate structure over a stack of nanostructures over a substrate; forming a gate spacer on a sidewall of the sacrificial gate structure; forming a source/drain opening by recessing the stack; forming inner spacer recesses in the stack; forming an inner spacer layer on the gate spacer and in the inner spacer recesses; trimming a first upper portion of the inner spacer layer; increasing width of the source/drain opening by trimming a second upper portion of the gate spacer while removing excess portions of the inner spacer layer outside the inner spacer recesses; and forming a source/drain region in the source/drain opening after the increasing width.

In accordance with at least one embodiment, a method comprises: forming a sacrificial gate structure over a stack of nanostructures over a substrate; forming a gate spacer on a sidewall of the sacrificial gate structure; after the forming a gate spacer, forming a source/drain opening by recessing the stack; increasing width of the source/drain opening by trimming an upper portion of the gate spacer; and forming a source/drain region in the source/drain opening after the increasing width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming a sacrificial gate structure over a stack of nanostructures over a substrate;

forming a gate spacer on a sidewall of the sacrificial gate structure;

forming a source/drain opening by recessing the stack;

forming inner spacer recesses in the stack;

forming an inner spacer layer on the gate spacer and in the inner spacer recesses;

trimming a first upper portion of the inner spacer layer;

increasing width of the source/drain opening by trimming a second upper portion of the gate spacer while removing excess portions of the inner spacer layer outside the inner spacer recesses; and forming a source/drain region in the source/drain opening after the increasing width.

2. The method of claim 1, wherein the forming a gate spacer includes:

forming a first spacer layer on the sidewall of the sacrificial gate structure; and forming a second spacer layer on the first spacer layer;

wherein the trimming a second upper portion includes thinning the second spacer layer.

3. The method of claim 2, further comprising:

forming a mask layer on the inner spacer layer to a level above an upper surface of an uppermost nanostructure of the stack.

4. The method of claim 1, wherein the trimming a second upper portion includes removing entirely the second upper portion.

5. The method of claim 1, further comprising:

forming a source/drain contact on the source/drain region, the source/drain contact having a first portion on the source/drain region and a second portion on the first portion, the second portion being adjacent to the second upper portion of the gate spacer, the second portion having larger width than the first portion.

6. The method of claim 5, wherein a width ratio of the first portion and the second portion is in a range of about 0.15 to about 0.25.

7. The method of claim 5, wherein a height ratio of the first portion and the second portion is in a range of about 0.5 to about 0.95.

8. A method, comprising:

forming a sacrificial gate structure over a stack of nanostructures over a substrate;

forming a gate spacer on a sidewall of the sacrificial gate structure;

after forming the gate spacer, forming a source/drain opening by recessing the stack;

increasing width of the source/drain opening by trimming an upper portion of the gate spacer; and forming a source/drain region in the source/drain opening after the increasing width.

9. The method of claim 8, further comprising:

forming inner spacer recesses in the stack.

10. The method of claim 9, wherein the forming inner spacer recesses is after the increasing width of the source/drain opening.

11. The method of claim 9, further comprising:

forming a mask layer in the source/drain opening, the mask layer filling the inner spacer recesses;

wherein the trimming an upper portion includes trimming portions of the gate spacer exposed by the mask layer.

12. The method of claim 11, wherein the forming a gate spacer includes:

forming a first spacer layer on the sacrificial gate structure; and forming a second spacer layer on the first spacer layer;

wherein the trimming an upper portion includes reducing width of the second spacer layer above a level, the level being above an uppermost nanostructure of the stack.

13. The method of claim 8, further including:

after forming the source/drain region, replacing the sacrificial gate structure with an active gate structure;

forming an etch stop layer on the gate spacer; and forming a source/drain contact on the source/drain region and the etch stop layer.

14. A method, comprising:

forming a sacrificial gate structure over a stack of nanostructures over a substrate;

forming a gate spacer on a sidewall of the sacrificial gate structure;

forming a source/drain opening by recessing the stack;

forming inner spacer recesses in the stack;

forming a mask layer in the source/drain opening prior to forming an inner spacer layer;

trimming an upper portion of the gate spacer while the mask layer is in the source/drain opening;

removing the mask layer;

forming the inner spacer layer in the inner spacer recesses after the removing the mask layer; and forming a source/drain region in the source/drain opening.

15. The method of claim 14, wherein the mask layer extends into the inner spacer recesses.

16. The method of claim 14, wherein the trimming an upper portion of the gate spacer includes performing an isotropic etch.

17. The method of claim 14, wherein the forming a gate spacer includes:

forming a first spacer layer on the sidewall of the sacrificial gate structure; and forming a second spacer layer on the first spacer layer;

wherein the trimming an upper portion includes thinning or removing the second spacer layer.

18. The method of claim 14, wherein the mask layer extends to a level above an upper surface of an uppermost nanostructure of the stack.

19. The method of claim 14, further comprising:

after forming the source/drain region, replacing the sacrificial gate structure with an active gate structure.

20. The method of claim 14, further comprising:

forming a source/drain contact on the source/drain region, the source/drain contact having a T-shape with an upper portion having larger width than a lower portion.

* * * * *